(12) United States Patent
Wu et al.

(10) Patent No.: US 12,099,272 B2
(45) Date of Patent: *Sep. 24, 2024

(54) FOLDABLE TOUCH DISPLAY DEVICE HAVING AN INSULATING LAYER WITH DIFFERENT THICKNESSES

(71) Applicant: InnoLux Corporation, Miao-Li County (TW)

(72) Inventors: Yuan-Lin Wu, Miao-Li County (TW); Jui-Jen Yueh, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/118,146

(22) Filed: Mar. 7, 2023

(65) Prior Publication Data
US 2023/0213812 A1    Jul. 6, 2023

Related U.S. Application Data

(63) Continuation of application No. 17/523,853, filed on Nov. 10, 2021, now Pat. No. 11,619,844, which is a
(Continued)

(51) Int. Cl.
*G02F 1/13357* (2006.01)
*G02F 1/1335* (2006.01)
(Continued)

(52) U.S. Cl.
CPC ...... *G02F 1/1336* (2013.01); *G02F 1/133514* (2013.01); *G06F 1/1601* (2013.01); *G06F 3/0412* (2013.01); *G09G 3/20* (2013.01);
*H10K 59/351* (2023.02); *H10K 59/352* (2023.02); *H10K 59/353* (2023.02); *H10K 59/38* (2023.02); *G02F 1/133562* (2021.01);
(Continued)

(58) Field of Classification Search
CPC ..................................................... G02F 1/1336
USPC ........................................................ 345/174
See application file for complete search history.

(56) References Cited

U.S. PATENT DOCUMENTS

2015/0227172 A1*  8/2015  Namkung ............... H10K 59/40
                                                    345/173
2016/0282661 A1*  9/2016  Nam .................. G02F 1/133305
(Continued)

Primary Examiner — Long D Pham
(74) Attorney, Agent, or Firm — Winston Hsu

(57) ABSTRACT

A touch display device includes a substrate, a display layer disposed on the substrate, an insulating layer disposed on the display layer, and a touch electrode layer directly contacting the insulating layer. The display layer includes a first region, a second region, and a third region. The second region is located between the first region and the third region. The second region is foldable. The touch electrode layer includes a mesh structure, wherein the insulating layer is disposed between the display layer and the mesh structure. The insulating layer includes a first layer, a second layer, and a third layer. The second layer is disposed between the first layer and the third layer. The first layer and the third layer are formed of inorganic insulating materials. The second layer is formed of organic insulating material. The thickness of the first layer is greater than the thickness of the third layer.

8 Claims, 25 Drawing Sheets

Related U.S. Application Data continuation of application No. 16/861,244, filed on Apr. 29, 2020, now Pat. No. 11,194,191, which is a continuation of application No. 15/673,435, filed on Aug. 10, 2017, now abandoned.

(60) Provisional application No. 62/500,539, filed on May 3, 2017, provisional application No. 62/479,326, filed on Mar. 31, 2017.

(51) Int. Cl.
    *G06F 1/16* (2006.01)
    *G06F 3/041* (2006.01)
    *G09G 3/20* (2006.01)
    *H10K 59/35* (2023.01)
    *H10K 59/38* (2023.01)
    *G09G 3/36* (2006.01)
    *H10K 50/86* (2023.01)
    *H10K 59/40* (2023.01)

(52) U.S. Cl.
    CPC .. *G02F 1/133603* (2013.01); *G02F 1/133614* (2021.01); *G02F 1/133616* (2021.01); *G02F 2201/52* (2013.01); *G02F 2202/36* (2013.01); *G02F 2203/30* (2013.01); *G06F 2203/04102* (2013.01); *G06F 2203/04111* (2013.01); *G06F 2203/04112* (2013.01); *G09G 3/3607* (2013.01); *G09G 2300/0452* (2013.01); *H10K 50/865* (2023.02); *H10K 59/40* (2023.02)

(56) References Cited

U.S. PATENT DOCUMENTS

| | | | |
|---|---|---|---|
| 2016/0328036 A1* | 11/2016 | Lee | G06F 3/04186 |
| 2016/0378224 A1* | 12/2016 | Kwon | H10K 59/40 |
| | | | 345/174 |
| 2017/0207276 A1* | 7/2017 | Miyamoto | G06F 3/0412 |
| 2017/0324058 A1* | 11/2017 | Min | H10K 50/841 |
| 2018/0204884 A1* | 7/2018 | Isa | H10K 77/111 |
| 2018/0213638 A1* | 7/2018 | Osawa | G06F 3/0412 |

\* cited by examiner

FOLDABLE TOUCH DISPLAY DEVICE HAVING AN INSULATING LAYER WITH DIFFERENT THICKNESSES

CROSS REFERENCE TO RELATED APPLICATIONS

This application is a continuation application of U.S. application Ser. No. 17/523,853, filed on Nov. 10, 2021, which is a continuation application of U.S. application Ser. No. 16/861,244, filed on Apr. 29, 2020, which is a continuation application of U.S. application Ser. No. 15/673,435, filed on Aug. 10, 2017, which claims the benefit of U.S. Provisional Application No. 62/479,326, filed on Mar. 31, 2017, and claims the benefit of U.S. Provisional Application No. 62/500,539, filed on May 3, 2017. The contents of these applications are incorporated herein by reference.

BACKGROUND OF THE DISCLOSURE

1. Field of the Disclosure

The present disclosure relates to a touch display panel, and more particularly, to a foldable touch display panel.

2. Description of the Prior Art

In recent years, foldable electronic devices have become one of the focuses of the new generation electronic technology. The demand of the foldable touch display device that can be integrated in the foldable electronic device is therefore increased. A foldable touch display device means the device can be curved, folded, stretched, flexed, or the like (generally referred to as "foldable"). However, some elements or films of the conventional touch display device may be damaged due to the folding or flexing state of the touch display device, such as the touch electrodes and the encapsulation layer. Thus, the stability and the reliability of the foldable touch display device are seriously affected.

SUMMARY OF THE DISCLOSURE

The present disclosure provides a touch display device including a substrate, a display layer disposed on the substrate, an insulating layer disposed on the display layer, and a touch electrode layer directly contacting the insulating layer. The display layer includes a first region, a second region, and a third region, wherein the second region is located between the first region and the third region. The second region is foldable. The touch electrode layer includes a mesh structure, wherein the insulating layer is disposed between the display layer and the mesh structure. The insulating layer includes a first layer, a second layer, and a third layer. The second layer is disposed between the first layer and the third layer. The first layer and the third layer are formed of inorganic insulating materials. The second layer is formed of organic insulating material. The thickness of the first layer is greater than the thickness of the third layer.

The present disclosure further provides a touch display panel that includes a substrate, a display layer disposed on the substrate, an insulating layer disposed on the display layer, and a touch electrode layer directly contacting the insulating layer. The insulating layer is disposed between the display layer and the touch electrode layer. The display layer comprises a first region, a second region, and a third region, wherein the second region is located between the first region and the third region. The second region is foldable. The insulating layer has a first thickness corresponding to the first region and a second thickness corresponding to the second region, and the first thickness is different from the second thickness. The insulating layer comprises a first layer, a second layer, and a third layer, wherein the second layer is disposed between the first layer and the third layer. The first layer and the third layer are formed of inorganic insulating materials, and the second layer is formed of organic insulating material.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
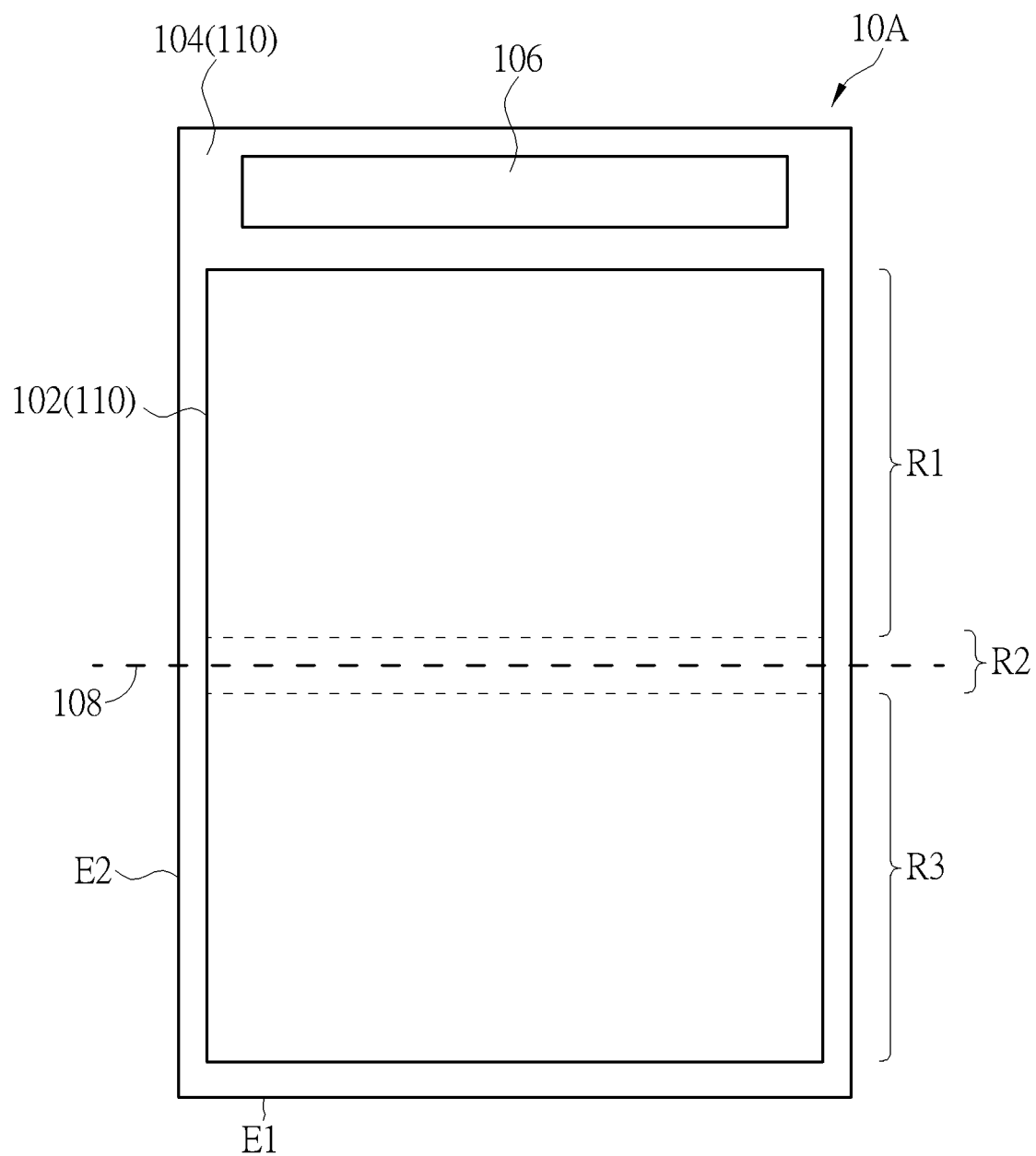
FIG. 1 is a top-view schematic diagram of a touch display device according to a first embodiment of the present disclosure.

Referring to FIG. 1, FIG. 1 is a top-view schematic diagram of a touch display device according to a first embodiment of the present disclosure. As shown in FIG. 1, a touch display device 10A of this embodiment includes a substrate 110, and the substrate 110 has a display region 102 and a peripheral region 104 defined thereon. The peripheral region 104 is positioned at a side of the display region 102, wherein the peripheral region 104 surrounds the display region 102 in this embodiment, but not limited thereto. The display region 102 includes light emitting elements and touch sensing elements disposed therein, and therefore the display region 102 provides the at least functions of displaying images and/or sensing touch positions. The peripheral region 104 may include one integrated circuit (IC) 106 electrically connected to the elements in the display region 102, in order to process different kinds of data for different purposes. In other embodiment, the peripheral region 104 may include at least one integrated circuit (IC) 106 electrically connected to the elements in the display region 102. The IC 106 may also include contacts or pins that are electrically connected to a printed circuit board (PCB) or the like (not shown). In this embodiment, the touch display device 10A is foldable (e.g., bendable, flexible, stretchable, etc.), wherein a folding axis 108 of the foldable touch display device 10A is parallel to an edge E1 of the substrate 110, and the edge E1 has a shorter length than another edge E2 of the substrate 110. In this embodiment, the edge E1 is also parallel to a shorter side of the display region 102. In addition, the display region 102 has at least a first region R1, a second region R2, and a third region R3. The second region R2 is disposed between the first region R1 and the third region R3 in a direction that is perpendicular to the folding axis 108, wherein the folding axis 108 passes through the second region R2. The second region R2 is a region of the touch display device 10A that is bendable or foldable.

Figure 2:
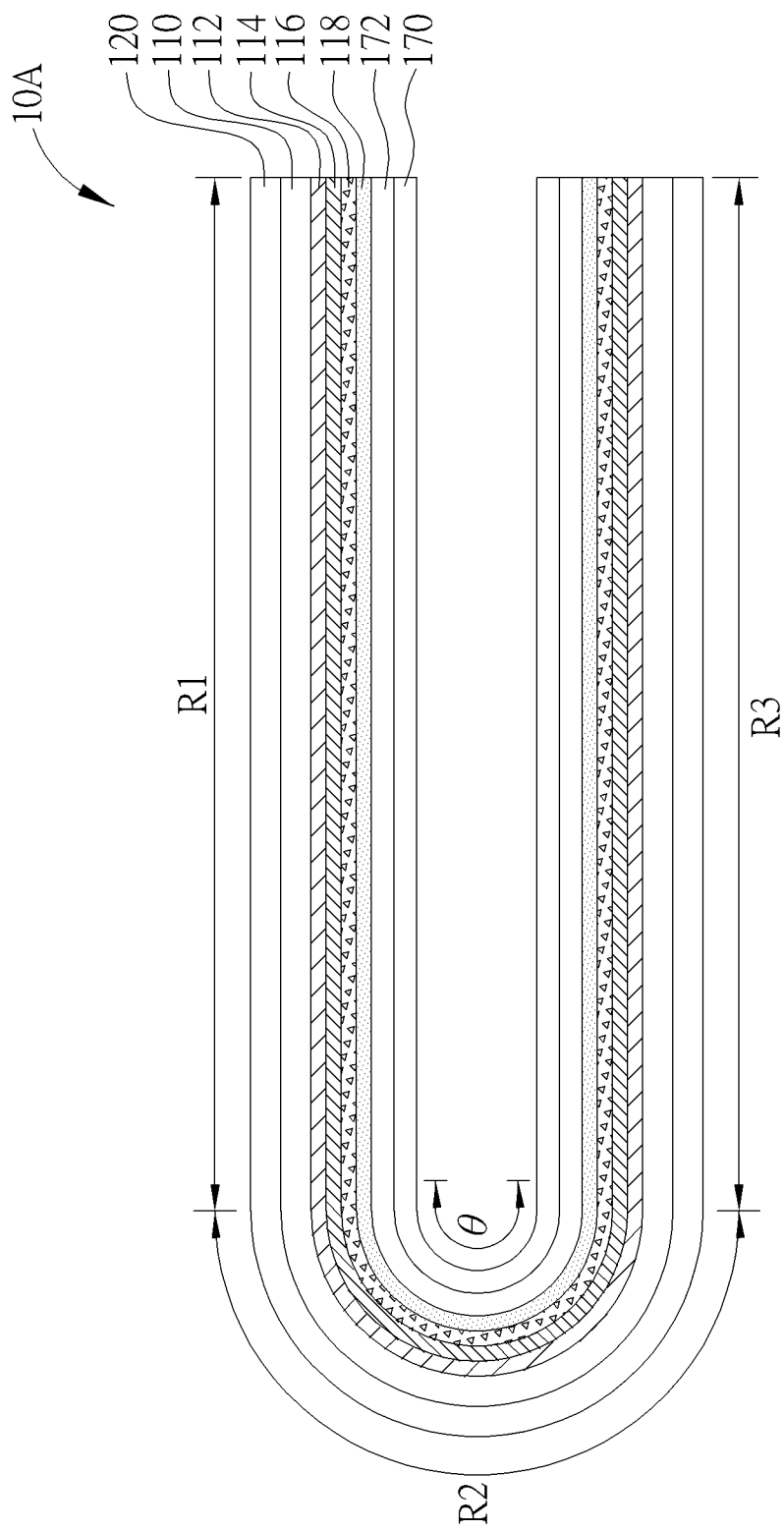
FIG. 2 is a cross-sectional schematic diagram of the display device according to the first embodiment of the present disclosure.

Referring to FIG. 2, FIG. 2 is a cross-sectional schematic diagram of the display device according to the first embodiment of the present disclosure. For clarity, only the profiles of the layers of the first region R1, the second region R2 and the third region R3 of the touch display device 10A are illustrated, while the details of the elements on the layers are not shown. As shown in FIG. 2, the touch display device 10A is folded, and a folding angle θ is 180 degrees for example. The folding angle θ ranges from 0 degree to 180 degrees in this embodiment, but not limited thereto. The touch display device 10A includes a substrate 110, a thin film transistor (TFT) layer 112, a display layer 114, an insulating layer 116, and a touch electrode layer 118, wherein the display layer 114 is disposed on the substrate 110, the TFT layer 112 is disposed between the insulating layer 116 and the substrate 110, the insulating layer 116 is disposed on the display layer 114, the touch electrode layer 118 directly contacts the insulating layer 116, and the insulating layer 116 is disposed between the display layer 114 and the touch electrode layer 118. The display layer 114 has a first region R1, a second region R2 and a third region R3, the second region R2 is located between the first region R1 and the third region R3, and the second region R2 is foldable. In this embodiment, when the touch display device 10A is folded, the portions of the display layer 114 corresponding to the first region R1 and the third region R3 is placed between the portion of the substrate 110 corresponding to the first region R1 and the portion of the substrate 110 corresponding to the third region R3. That is to say, the touch display device 10A is folded inwardly since the display layer 114 is sandwiched between the folded substrate 110 when the touch display device 10A is folded.

In addition, the touch display device 10A may selectively include a cover layer 170 disposed on the touch electrode layer 118 and a polarizer 172 disposed between the cover layer 170 and the touch electrode layer 118. The cover layer 170 is used for providing protection to layers disposed therebelow and may include a transparent insulating material for example. The polarizer 170 in this embodiment may include a plastic polarizer for example, but not limited thereto.

Figure 3:
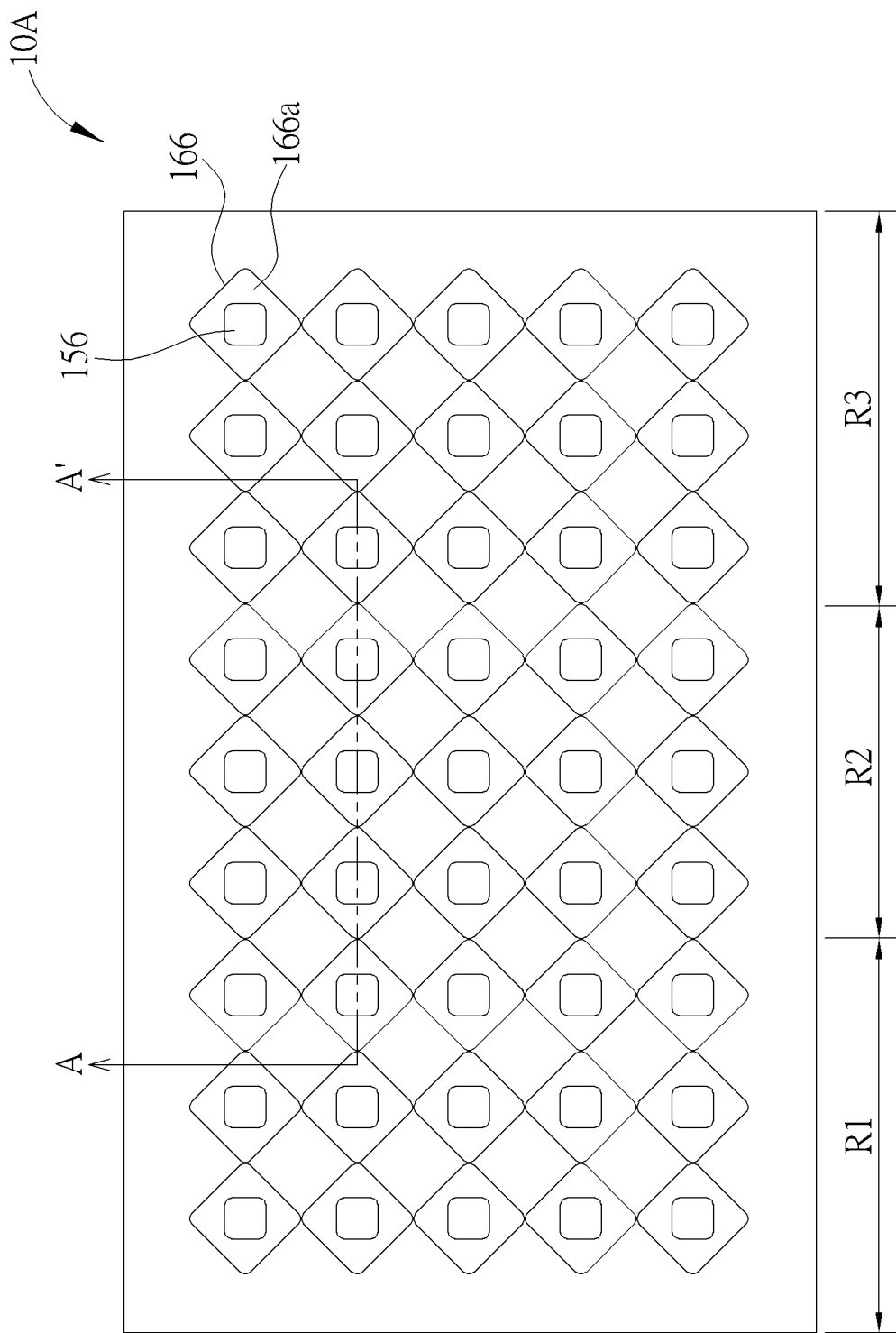
FIG. 3 is a top-view schematic diagram of a mesh structure and corresponding display units according to the first embodiment of the present disclosure.
Figure 4:
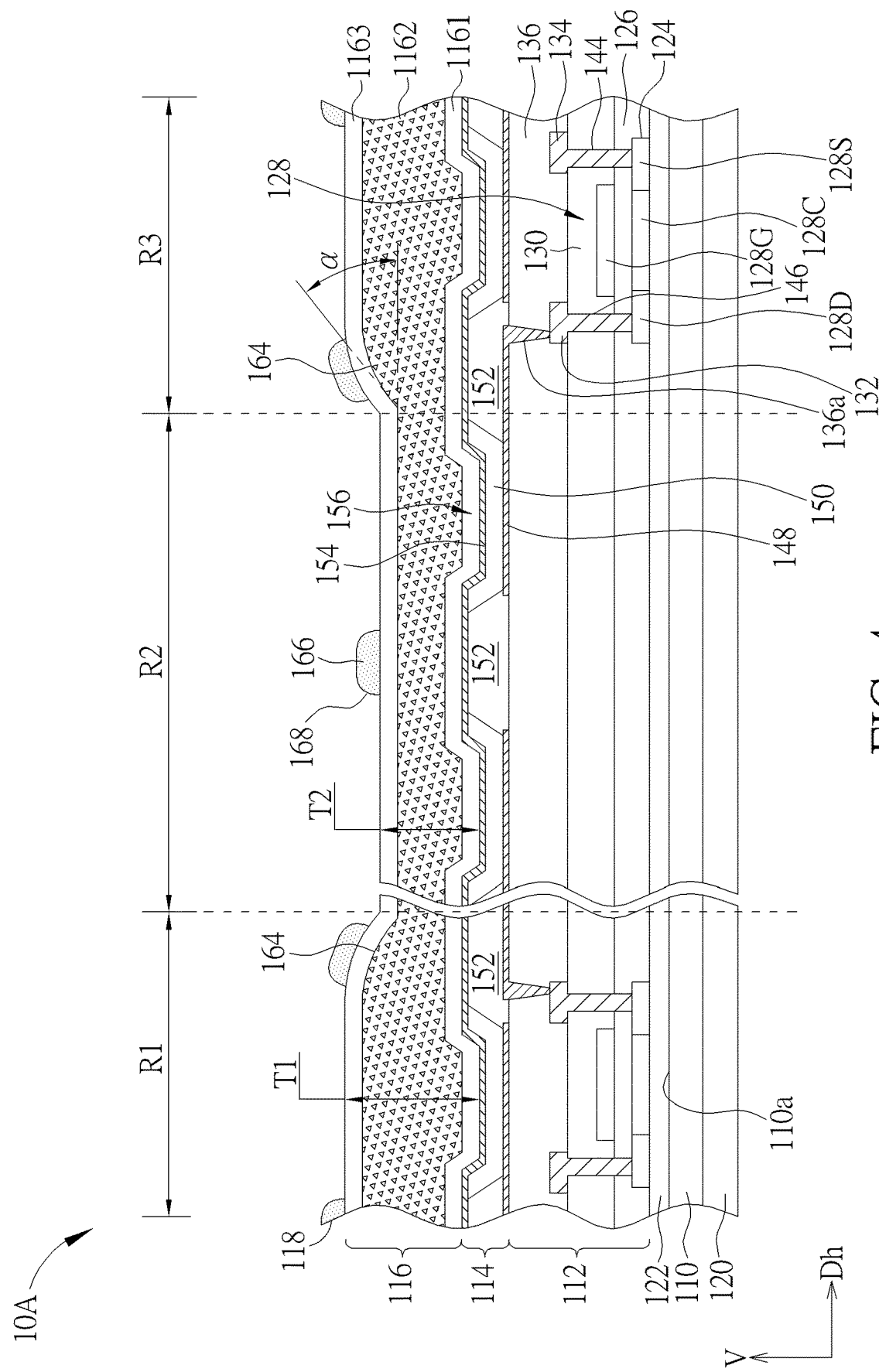
FIG. 4 is a cross-sectional schematic diagram taken along a line A-A' in FIG. 3.

Referring to FIG. 3 and FIG. 4, FIG. 3 is a top-view schematic diagram of a mesh structure and corresponding display units according to the first embodiment of the present disclosure, and FIG. 4 is a cross-sectional schematic diagram taken along a line A-A' in FIG. 3. For clarity, FIG. 4 only shows a portion of the first region R1, the second region R2, and the third region R3, and layers disposed on the touch electrode layer 118 are omitted. As shown in FIG. 4, the substrate 110 is flexible and may include a polymer layer, such as a thin plastic film formed from polyimide, polyethylene naphthalate (PEN), polyethylene terephthalate (PET), or other suitable polymers or combination of such polymers, but not limited thereto. The substrate 110 is selectively disposed on a supporting film 120, and a buffer layer 122 may be disposed between the substrate 110 and the TFT layer 112. In this embodiment, the supporting film 120 may include PET or the like, and the buffer layer 122 may include an oxide layer, a nitride layer or other suitable insulating layer, but not limited thereto.

The TFT layer 112 includes a semiconductor layer 124, a dielectric layer 126, a conductive layer having gate electrodes 128G, a dielectric layer 130, a conductive layer having drain electrodes 132 and source electrodes 134, and an optional dielectric layer 136, so as to form a plurality of TFTs 128, which serve as switch elements for driving the display units 156 in the display layer 114. The semiconductor layer 124 is formed of a semiconductor material, such as silicon or metal oxide, but not limited thereto. For example, the semiconductor layer 124 may be amorphous silicon, polysilicon, or indium gallium zinc oxide (IGZO). The semiconductor layer 124 includes a source contact 128S, a drain contact 128D, and a channel 128C disposed between the source contact 128S and the drain contact 128D in one TFT 128. Each source electrode 134 is electrically connected to the corresponding source contact 128S through a via hole 144 in the dielectric layer 130 and the dielectric layer 126. Each drain electrode 132 is electrically connected to the corresponding drain contact 128D through another via hole 146 in the dielectric layer 130 and the dielectric layer 126. The gate electrode 128G is separated from the channel 128C by the dielectric layer 126 (e.g., a gate dielectric layer). The gate electrode 128G, the source electrode 134 and the drain electrode 132 may be formed of conductive materials (such as metal), but not limited thereto. It should be noted that the structure of the TFTs 128 shown in FIG. 4 is merely an example and is not meant to limit the types or structures of the TFTs 128 of the present disclosure, and any other suitable TFT structures may replace the illustrated TFTs 128. For example, the TFTs 128 are top-gate type TFTs in this embodiment; however, bottom-gate type TFTs may be used as the TFTs 128 in a variant embodiment.

The display layer 114 includes a plurality of display units 156 and a barrier portion 152. In this embodiment, the display units 156 are organic light-emitting diodes (OLED) as an example, but not limited thereto. In other embodiment, the display unit 156 may be any other suitable types of display units or have other structures, such as micro LEDs, quantum dots (QD) or phosphors. The display units 156 may be defined by openings of the barrier portion 152 from top-view as shown in FIG. 3. Each display unit 156 shown in FIG. 4 is formed of a first electrode 148, an organic layer 150, and a second electrode 154, and the display areas of the display units 156 are separate from each other by the barrier portion 152 for that the barrier portion 152 is disposed between the adjacent display units 156. Specifically, a region of a conductive layer that forms the first electrodes 148 overlapped with one of the openings of the barrier portion 152 from top-view is approximately defined as the first electrode 148 of each display unit 156. Similarly, a region of a conductive layer that forms the second electrodes 154 overlapped with one of the openings of the barrier portion 152 from top-view is approximately as the second electrode 154 of each display unit 156 is. The first electrode 148 of each display unit 156 may be electrically connected to the TFT 128 respectively through a conductive electrode. In one embodiment, the first electrode 148 and the conductive electrode may share a same layer. The second electrodes 154 of different display units 156 may be electrically connected to each other. In one embodiment, the second electrodes 154 of different display units 156 may share a same layer. In each of the display units 156, the first electrode 148 may be an anode and the second electrode 154 may be a cathode of the display unit 156, and vice versa. The first electrode 148 is electrically connected to the corresponding drain electrode 132 through the via hole 136a in the dielectric layer 136. The organic layer 150 includes one or more layers of organic emissive material. The first electrode 148 and the second electrode 154 may include metal or transparent conductive material respectively. Examples of the metal material of the electrodes include Mg, Ca, Al, Ag, W, Cu, Ni, Cr, or an alloy thereof. Examples of the transparent conductive material include indium tin oxide (ITO), indium zinc oxide (IZO), zinc oxide, or indium oxide. In this embodiment, the first electrodes 148 are made of metal material, and the second electrodes 154 are made of transparent conductive material, but not limited thereto.

According to this embodiment, some of the TFTs 128 corresponding to the display units 156 situated in the second region R2 are disposed in the first region R1 and the third region R3 respectively, wherein the first electrodes 148 of such TFTs 128 extend from the first region R1 or the third region R3 to the second region R2. Thus, a number of the TFTs 128 disposed in the second region R2 is less than a number of the TFTs 128 disposed in the first region R1 or a number of the TFTs 128 disposed in the third region R3. As shown in FIG. 4, no TFT 128 is disposed below the illustrated display units 156 situated in the second region R2, but not limited thereto. This configuration can reduce the damage to the TFTs 128 when the second region R2 is folded. As a result, the electrical characteristics of the TFTs 128 can be maintained.

The insulating layer 116 selectively includes a first layer 1161, a second layer 1162 and a third layer 1163. The first layer 1161 is disposed between the display layer 114 and the second layer 1162, and the first layer 1161 is conformally formed on the display layer 114. The second layer 1162 is disposed between the first layer 1161 and the third layer 1163, and the third layer 1163 is conformally formed on the second layer 1162. The insulating layer 116 may be an encapsulation layer of the touch display device 10A for example. In this embodiment, the first layer 1161 and the third layer 1163 are formed of inorganic insulating materials, and the second layer 1162 is formed of organic insulating material, but not limited thereto. Further, the insulating layer 116 has a first thickness T1 corresponding to the display unit(s) 156 of the first region R1 and has a second thickness T2 corresponding to the display unit(s) 156 of the second region R2, and the first thickness T1 is different from the second thickness T2. Specifically, the first thickness T1 can be measured corresponding to a central region of the display units 156 of the first region R1, the second thickness T2 can be measured corresponding to a central region of the display unit 156 of the second region R2, and the first thickness T1 is greater than the second thickness T2 in this embodiment. A stress can accumulate in the second region R2 when the touch display device 10A is folded inwardly as shown in FIG. 2 (folding angle θ ranges from 0 degree to 180 degrees), and the design of decreasing the thickness (T2) of the insulating layer 116 in the second region R2 can reduce such stress and also improve the stability or the reliability. Similarly, the thickness of the insulating layer 116 corresponding to the display unit(s) 156 of the third region R3 is greater than the second thickness T2.

In addition, the second layer 1162 has at least one tapered surface 164 close to a border of the second region R2. In this embodiment, one of the tapered surfaces 164 is a portion of the surface of the second layer 1162 in the first region R1 adjoining to the second region R2 or in the third region R3 adjoining to the second region R2. In other embodiment, one of the tapered surfaces 164 is a portion of the surface of the second layer 1162 in the second region R2 that is adjoining to the first region R1 or a portion of the surface of the second layer 1162 in the second region R2 that is adjoining to the third region R3, but is not limited thereto. Specifically, in this embodiment, one of the tapered surfaces 164 is a portion of a surface of the second layer 1162 in the first region R1 that is adjoining to the second region R2, and another one of the tapered surfaces 164 is a portion of a surface of the second layer 1162 in the third region R3 that is adjoining to the second region R2. Further, an angle α of the tapered surface 164 is measured between a tangent line where the tapered surface 164 adjoining to the second region R2 and a horizontal direction Dh parallel to a surface 110a of the substrate 110, wherein the angle α ranges from 30 degrees to 70 degrees. Therefore, the thickness of the insulating layer 116 is gradually increased from the second region R2 to the first region R1 or to the third region R3. The smooth surface of the second layer 1162 or the insulating layer 116 can reduce the stress. Further, the smooth surface is beneficial to form the touch electrode layer 118 thereon compared to steeper surface, and thus the reliability of the touch electrode layer 118 can also be improved.

As shown in FIG. 3 and FIG. 4, the touch electrode layer 118 includes a mesh structure 166, wherein the mesh structure 166 and the barrier portion 152 are overlapped in a vertical projection direction V that is substantially perpendicular to the surface 110a of the substrate 110 in this embodiment. The mesh structure 166 has a plurality of mesh openings 166a, wherein each of the display units 156 is disposed corresponding to one of the mesh openings 166a, which means the mesh openings 166a expose the corresponding display units 156 respectively. Specifically, the mesh structure 166 and the barrier portion 152 of this embodiment are overlapped in the vertical projection direction V, and the mesh structure 166 does not overlap the display units 156, so that the display effect of the touch display device 10A is not affected by the mesh structure 166. One could understand that it is no need to dispose the display units 156 in every mesh opening 156 in this embodiment. Some of the mesh openings 166a do not have the display units 156 disposed therein. However, relative arrangement of the display units 156 and the mesh structure 166, as well as the mesh openings 156 may vary in different embodiments. The mesh structure 166 in this embodiment may include a multilayer structure, such as Titanium/Aluminum/Titanium for example. In addition, the mesh structure 166 in this embodiment has curve edges 168, which are the side edges of the mesh structure 166, and the curve edges 168 reduce the probability of electrostatic discharge.

The following description will detail the different embodiments or variant embodiments of the present disclosure. To simplify the description, identical components in each of the following embodiments or variant embodiments are marked with identical symbols. For making it easier to understand the differences between the embodiments, the following description will detail the dissimilarities among different embodiments and the identical technical features will not be redundantly described.

Figure 5:
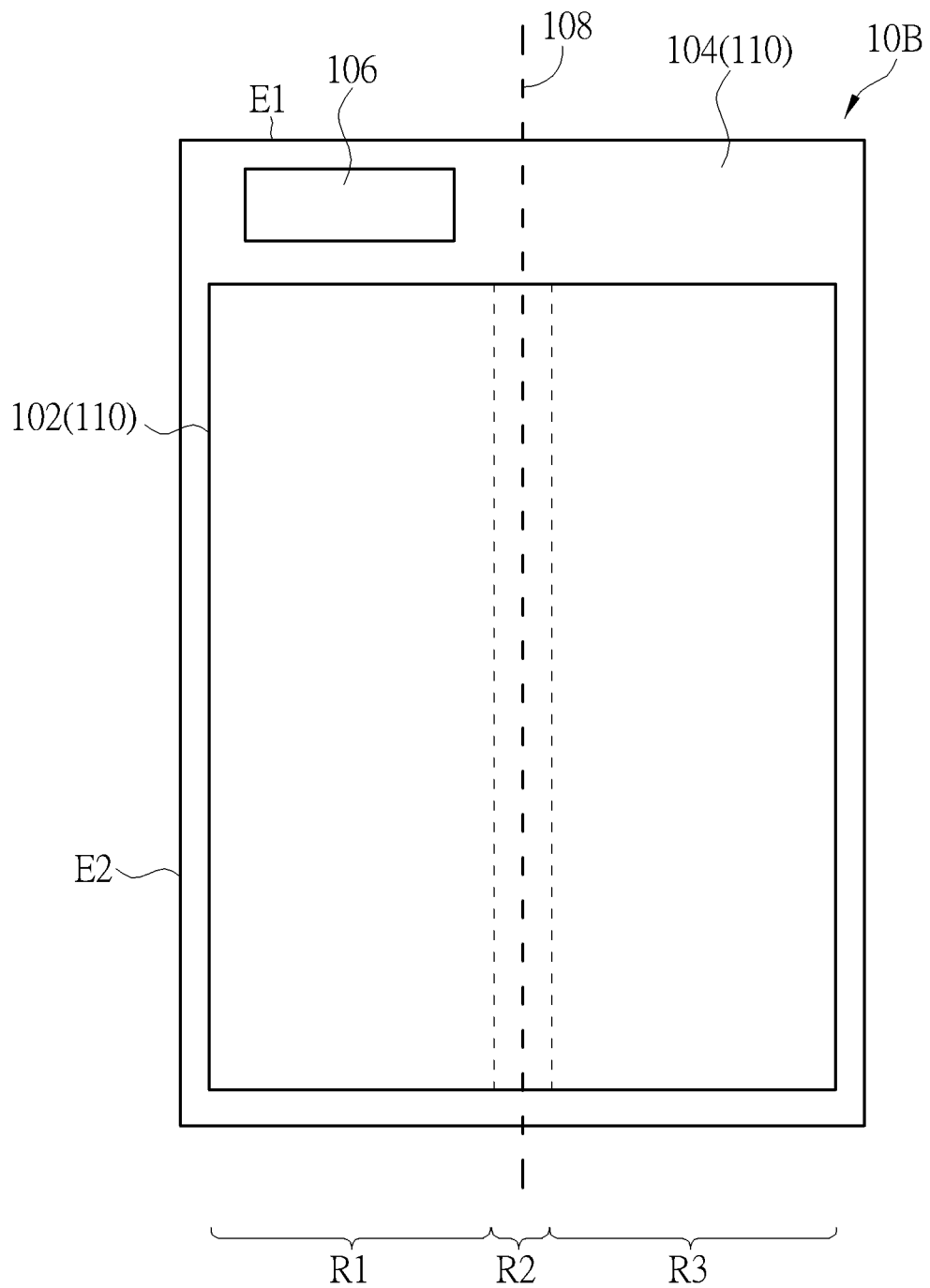
FIG. 5 is a top-view schematic diagram of a touch display device according to a variant embodiment of the first embodiment.

Referring to FIG. 5, FIG. 5 is a top-view schematic diagram of a touch display device according to a variant embodiment of the first embodiment. The difference between this variant embodiment and the first embodiment is that the folding axis 108 of a touch display device 10B shown in FIG. 5 is parallel to the edge E2 of the substrate 110 of the touch display device 10B, wherein the edge E2 has a longer length than another edge E1 of the substrate 110, and the edge E2 is also parallel to the longer side of the display region 102. In other words, the folding axis 108 in this variant embodiment is rotated 90 degrees from the folding axis 108 in the first embodiment. In addition, the arrangement of the first region R1, the second region R2, and the third region R3 are also rotated 90 degrees in this variant embodiment. The IC 106 in this variant embodiment is designed to have a smaller area in order to avoid the folding axis 108 to pass through the IC 106, and to further prevent the IC 106 from being damaged by bending or folding.

Figure 6:
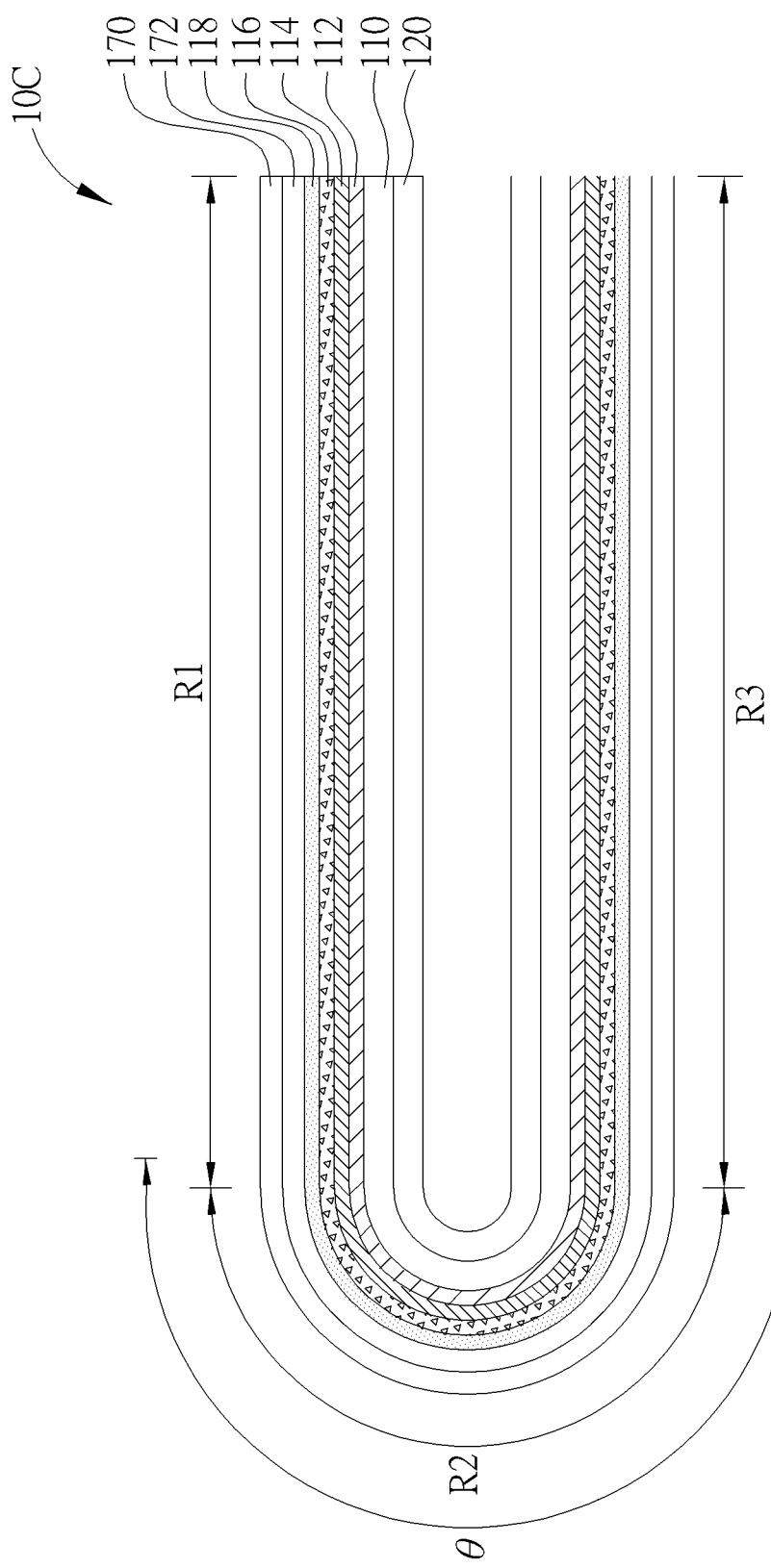
FIG. 6 is a cross-sectional schematic diagram of the display device according to a second embodiment of the present disclosure.

Referring to FIG. 6, FIG. 6 is a cross-sectional schematic diagram of the display device according to a second embodiment of the present disclosure. As shown in FIG. 6, the difference between this embodiment and the first embodiment is that the touch display device 10C is folded outwardly with reference to the display surface of the touch display device 10C. Specifically, the folding angle θ of the touch display device 10C ranges from 0 degree to −180 degrees in this embodiment, and FIG. 6 shows that the folding angle θ is −180 degrees for example. When the touch display device 10C is folded, the portions of the substrate 110 corresponding to the first region R1 and the third region R3 is placed between the portion of the display layer 114 corresponding to the first region R1 and the portion of the display layer 114 corresponding to the third region R3.

Figure 7:
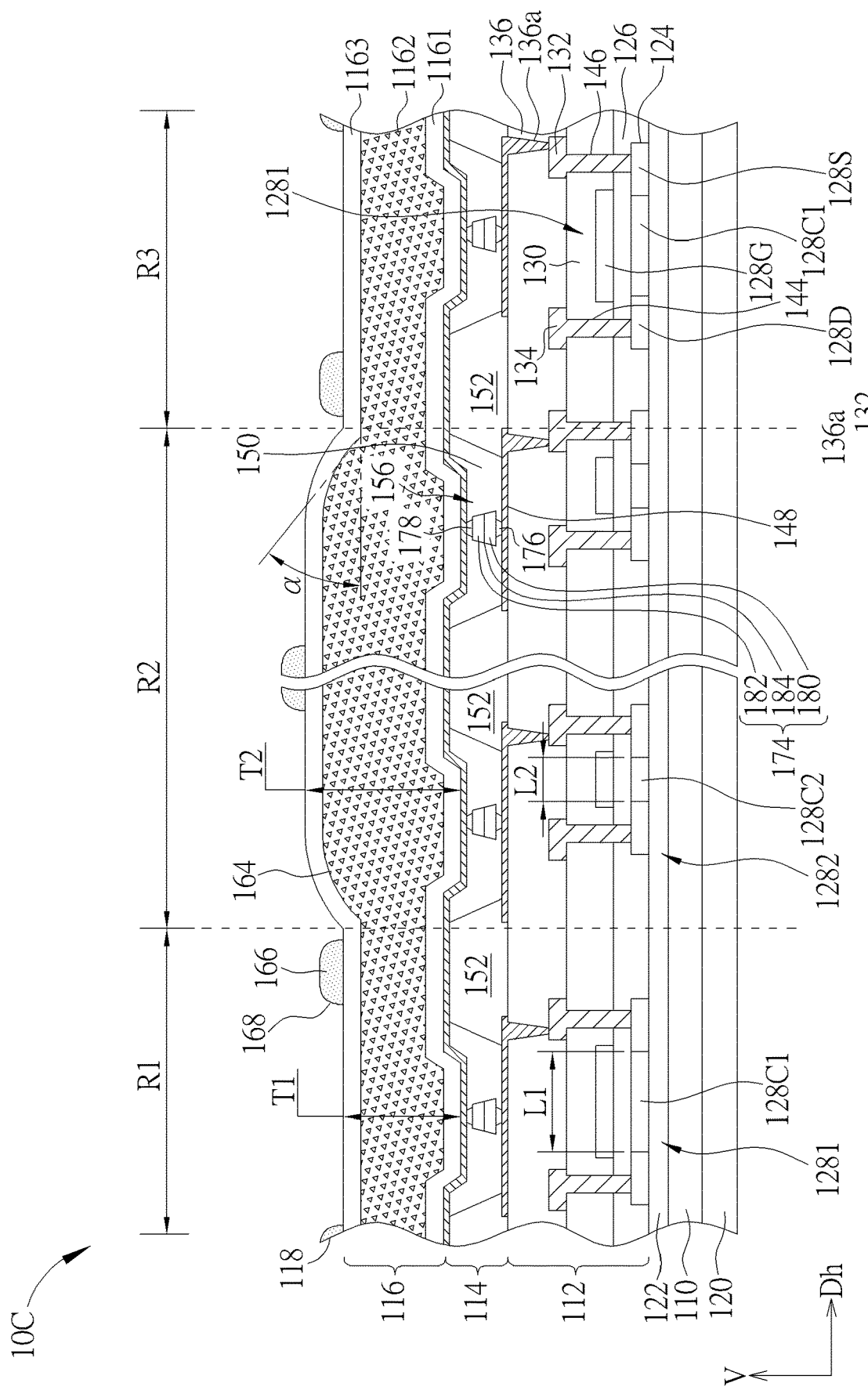
FIG. 7 is a cross-sectional schematic diagram of the display device according to the second embodiment.
Figure 8:
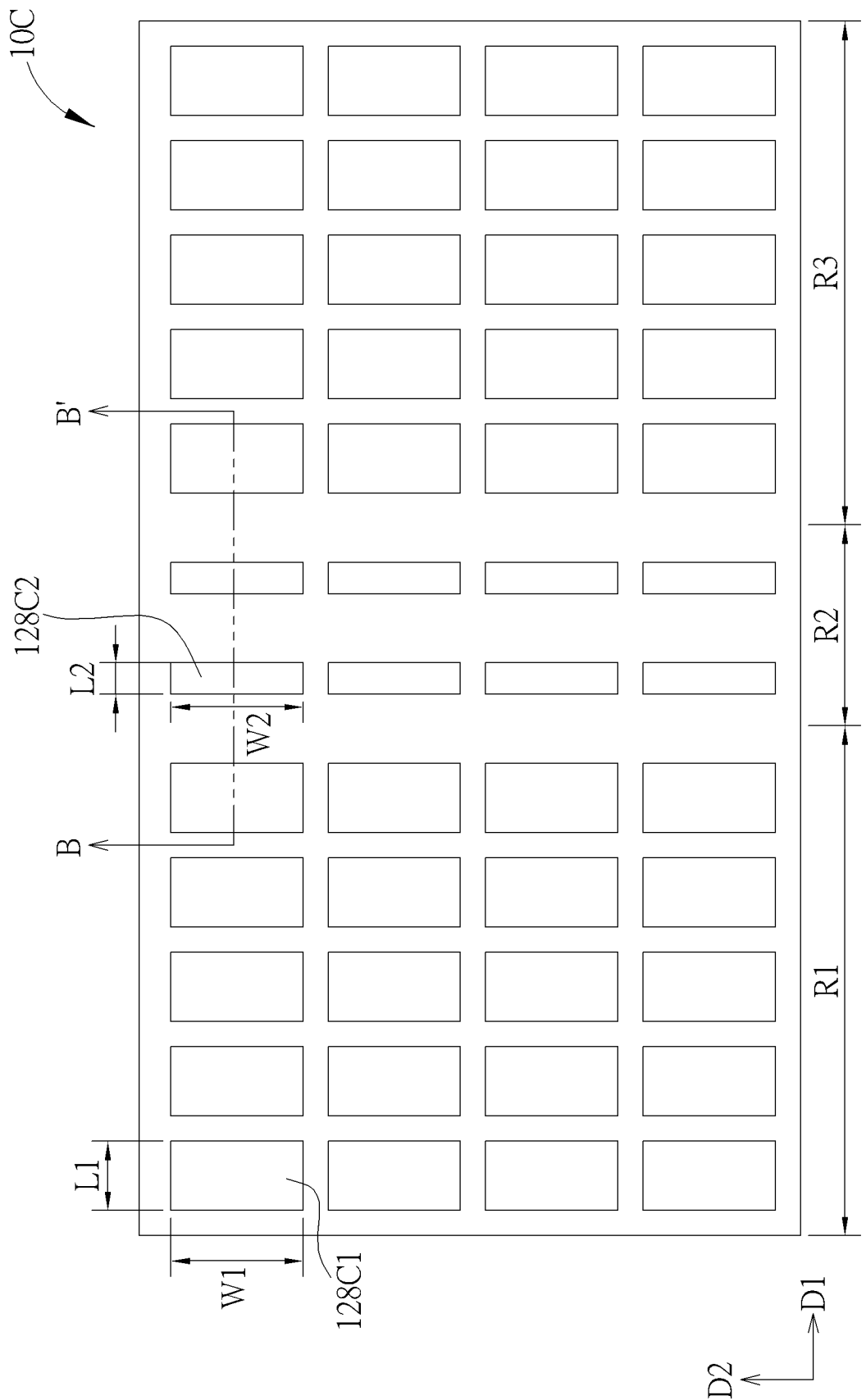
FIG. 8 is a top-view schematic diagram of channels of a thin film transistor layer according to the second embodiment.

Referring to FIG. 7 and FIG. 8, FIG. 7 is a cross-sectional schematic diagram of the display device according to the second embodiment, and FIG. 8 is a top-view schematic diagram of channels of the thin film transistor layer according to the second embodiment, wherein FIG. 7 corresponds to the sectional line B-B' in FIG. 8. The differences between this embodiment and the first embodiment are described below. As shown in FIG. 7, the first thickness T1 of the insulating layer 116 is smaller than the second thickness T2 of the insulating layer 116 in this embodiment. For example, a stress may accumulate in the second region R2 when the touch display device 10C is folded outwardly as shown in FIG. 6, and the design of thickening the thickness (T2) of the insulating layer 116 in the second region R2 can improve the stability or the reliability. Similarly, the thickness of the insulating layer 116 corresponding to the display unit(s) 156 of the third region R3 is smaller than the second thickness T2. In this embodiment, one of the tapered surfaces 164 is a portion of the surface of the second layer 1162 in the second region R2 that is adjoining to the first region R1, and another one of the tapered surfaces 164 is a portion of a surface of the second layer 1162 in the second region R2 that is adjoining to the third region R3. In other words, both the tapered surfaces 164 are close to the border of the second region R2. Thus, the thickness of the insulating layer 116 is gradually reduced from the second region R2 to the first region R1 or to the third region R3.

In this embodiment, the display units 156 include micro light-emitting diodes (micro LEDs). At least one micro LED can be disposed in one display unit 156. Color(s) of the micro LED(s) disposed in one display unit 156 may be the same or may be different, but is not limited thereto. One micro LED may include a p-n diode 174, a first contact electrode 176 located at one side of the p-n diode 174, and a second contact electrode 178 located at another side of the p-n diode 174. The p-n diode 174 may include a first semiconductor layer 180, a second semiconductor layer 182, and multi quantum well (MQW) structure 184 disposed between the first semiconductor layer 180 and the second semiconductor layer 182 for example. In this embodiment, the first semiconductor layer 180 is a p-type semiconductor layer and the second semiconductor layer 182 is an n-type semiconductor layer, and vice versa.

As shown in FIG. 7 and FIG. 8, the TFT layer 112 in this embodiment includes multiple TFTs 1281 disposed in the first region R1 and the third region R3, and the TFT layer 112 also includes multiple TFTs 1282 disposed in the second region R2 and under the corresponding display units 156, wherein a number of the TFTs 1282 roughly relates to a number of the display units 156 in the second region R2. A first channel 128C1 of each TFT 1281 has a channel width W1 and a channel length L1, and a second channel 128C2 of each TFT 1282 has a channel width W2 and a channel length L2. Specifically, the channel length L1 and the channel length L2 are the distances between the source contacts 128S and drain contacts 128D in the TFT 1281 and the TFT 1282 respectively. As shown in FIG. 8, the second region R2 is disposed between the first region R1 and the third region R3 in a first direction D1, wherein the channel length L1 and the channel length L2 are parallel to the first direction D1, and the channel width W1 and the channel width W2 are parallel to a second direction D2 that is perpendicular to the first direction D1 in this embodiment. In other words, the first direction D1 is substantially perpendicular to the folding axis 108 in FIG. 5, and both the first direction D1 and the second direction D2 are substantially parallel to a surface of the substrate 110 in FIG. 7. The channel width W1 and the channel width W2 are substantially identical, and the channel length L1 is greater than the channel length L2. Thus, a first ratio (W1/L1) of the channel width W1 to the channel length L1 of the TFT 1281 disposed in the first region R1 or in the third region R3 is different from a second ratio (W2/L2) of the channel width W2 to the channel length L2 of the TFT 1282 disposed in the second region R2. For example, the second ratio is greater than the first ratio in this embodiment, but not limited thereto. The first ratio and the second ratio can be adjusted according to the performances of the TFTs in different regions when folding the touch display device 10C. Also, the first ratio and the second ratio can be designed for reducing variations of the TFTs in different regions when folding.

Figure 9:
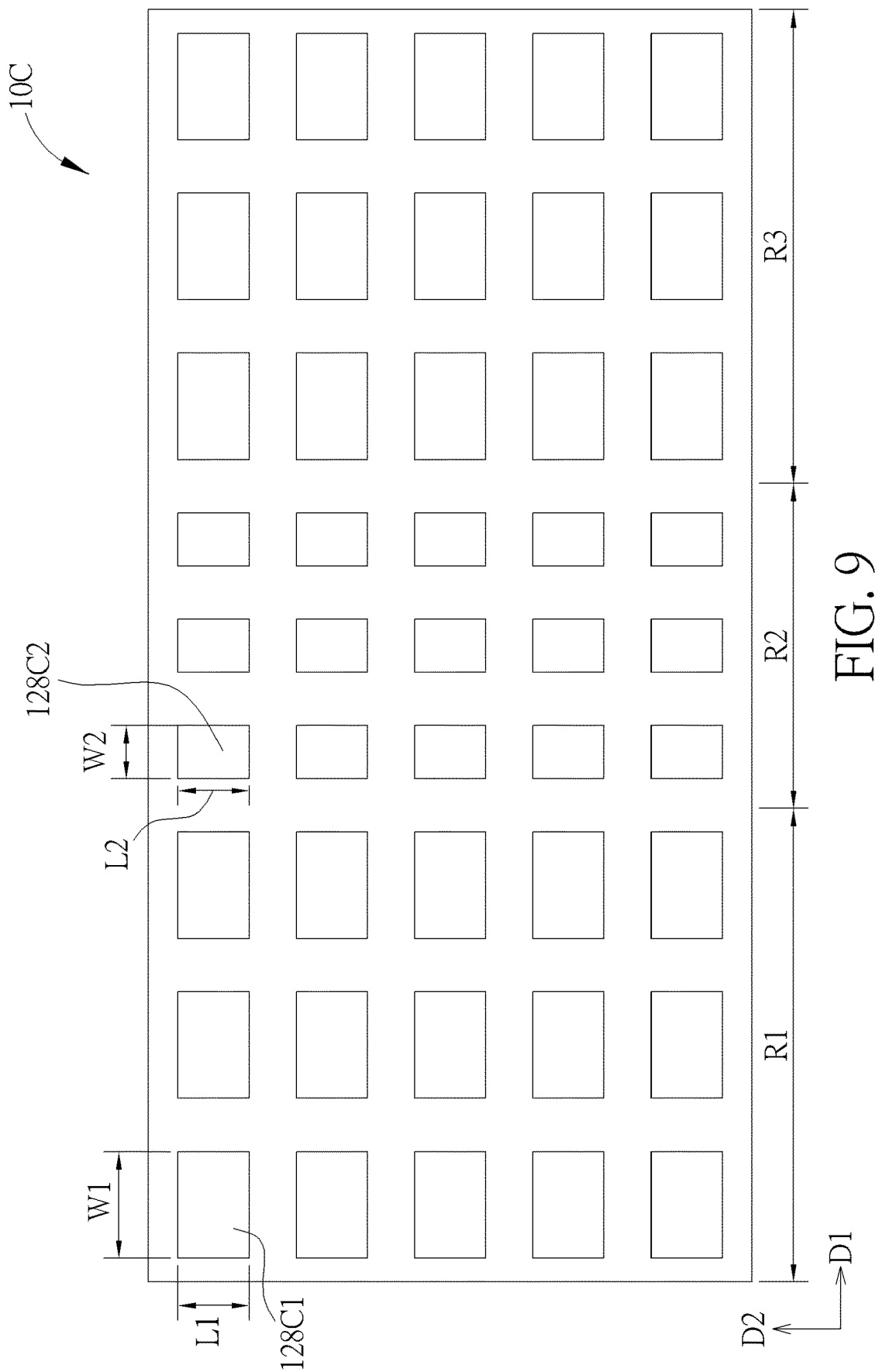
FIG. 9 is a top-view schematic diagram of channels of a thin film transistor layer according to a variant embodiment of the second embodiment.

Referring to FIG. 9, FIG. 9 is a top-view schematic diagram of channels of a thin film transistor layer according to a variant embodiment of the second embodiment. As shown in FIG. 9, the difference between this variant embodiment and the second embodiment is that the channel width W1 and the channel width W2 are parallel to the first direction D1, and the channel length L1 and the channel length L2 are parallel to the second direction D2. The channel width W1 is greater than the channel width W2 while the channel length L1 and the channel length L2 are substantially identical. Thus, the first ratio is greater than the second ratio in this variant embodiment.

Figure 10:
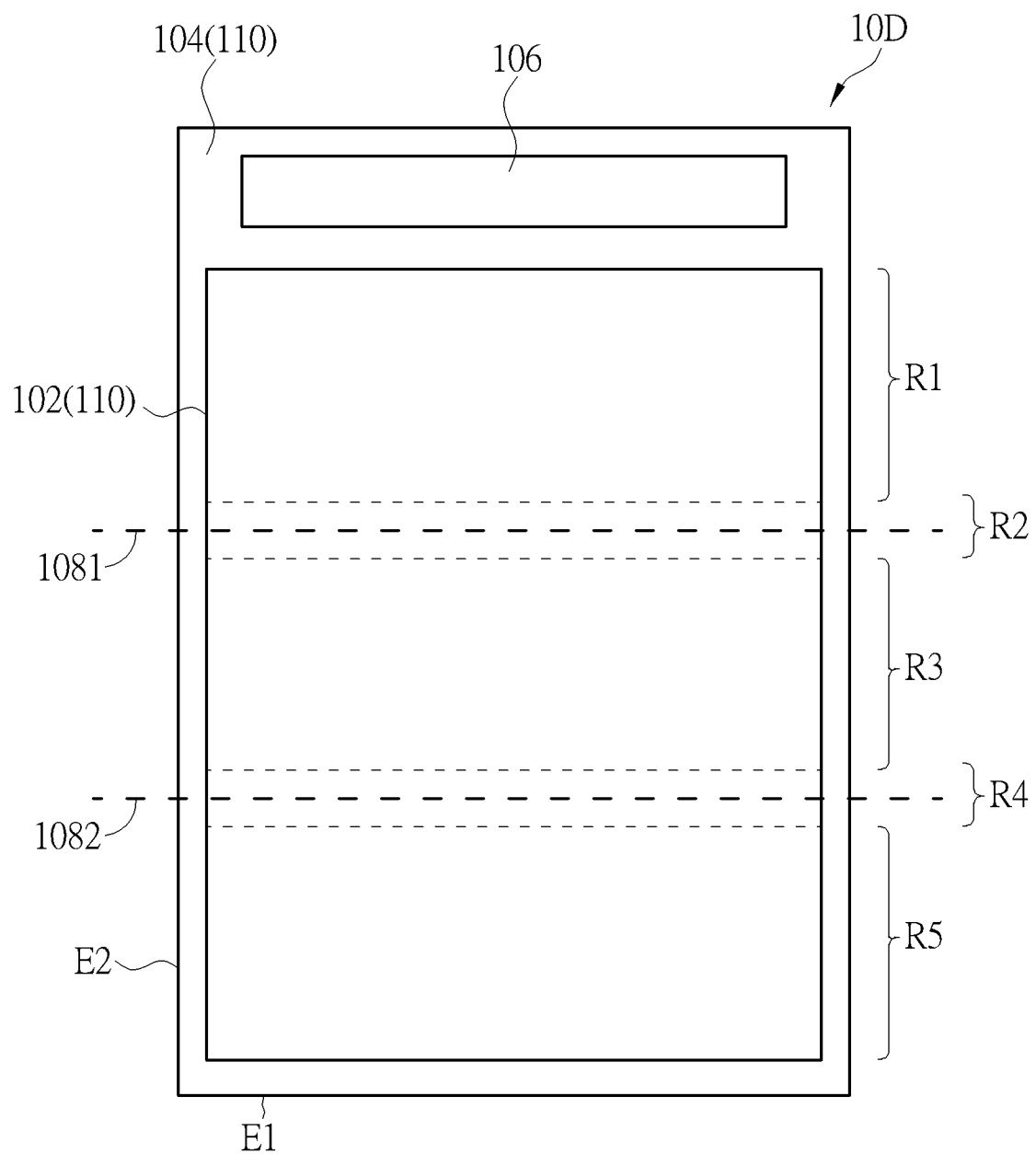
FIG. 10 is a top-view schematic diagram of a touch display device according to a third embodiment of the present disclosure.

Referring to FIG. 10, FIG. 10 is a top-view schematic diagram of a touch display device according to a third embodiment of the present disclosure. The main difference between this embodiment and the first embodiment is that the foldable touch display device 10D has two folding axes. In this embodiment, the touch display device 10D includes a folding axis 1081 and a folding axis 1082 parallel to the edge E1 of the substrate 110, wherein the edge E1 has a shorter length than another edge E2 of the substrate 110. In addition, the display region 102 can be at least divided into a first region R1, a second region R2, a third region R3, a fourth region R4, and a fifth region R5 based on the folding axis 1081 and the folding axis 1082. The second region R2 is disposed between the first region R1 and the third region R3, and the fourth region R4 is disposed between the third region R3 and the fifth region R5 in a direction that is perpendicular to the folding axis 1081 and the folding axis 1082, wherein the folding axis 1081 and the folding axis 1082 pass through the second region R2 and the fourth region R4 respectively, and both the folding axis 1081 and the folding axis 1082 do not pass through the first region R1, the third region R3, or the fifth region R5. Therefore, the second region R2 and the fourth region R4 are regions of the touch display device 10D that are bendable or foldable.

Figure 11:
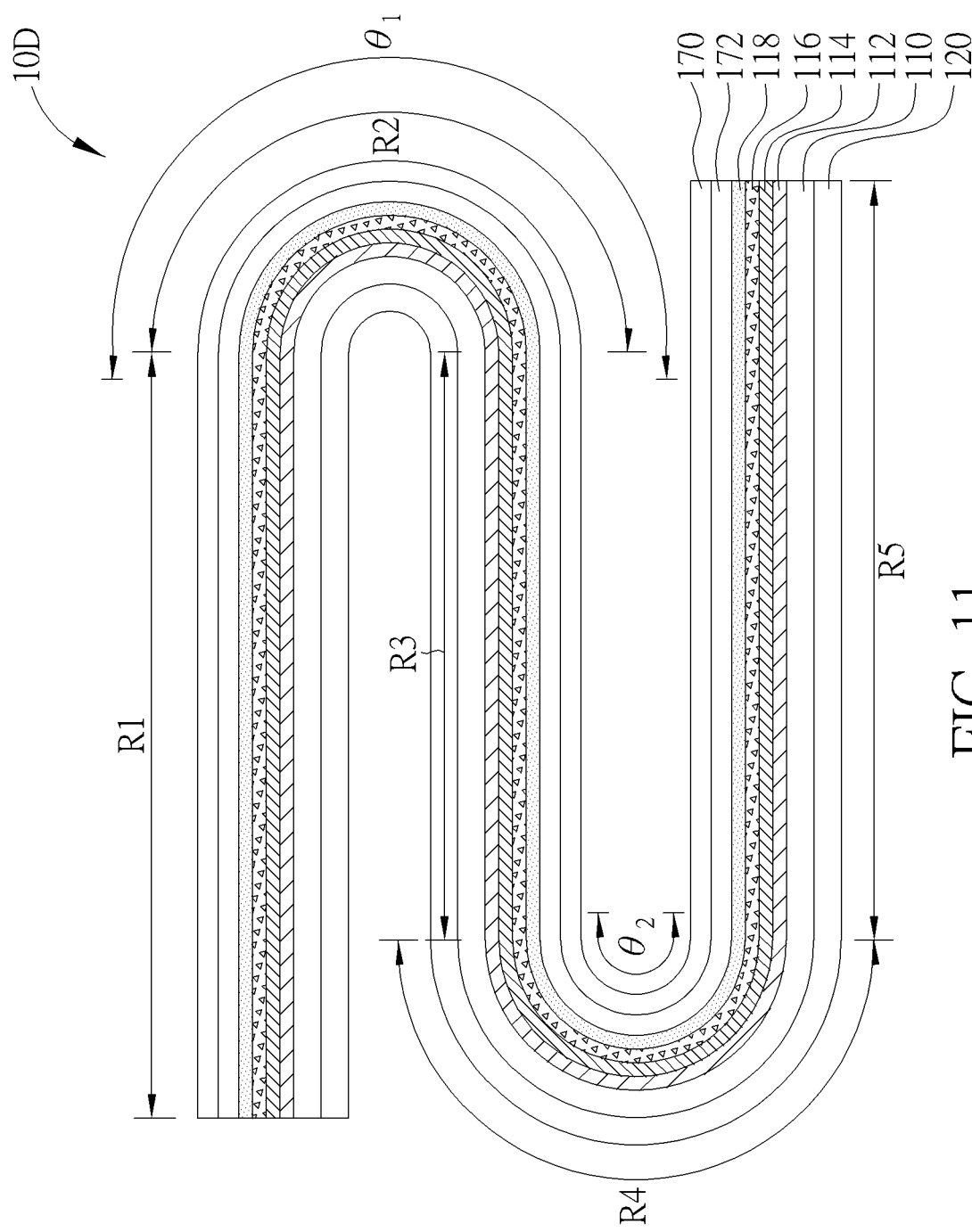
FIG. 11 is a cross-sectional schematic diagram of the display device according to the third embodiment shown in FIG. 10 of the present disclosure.
Figure 12:
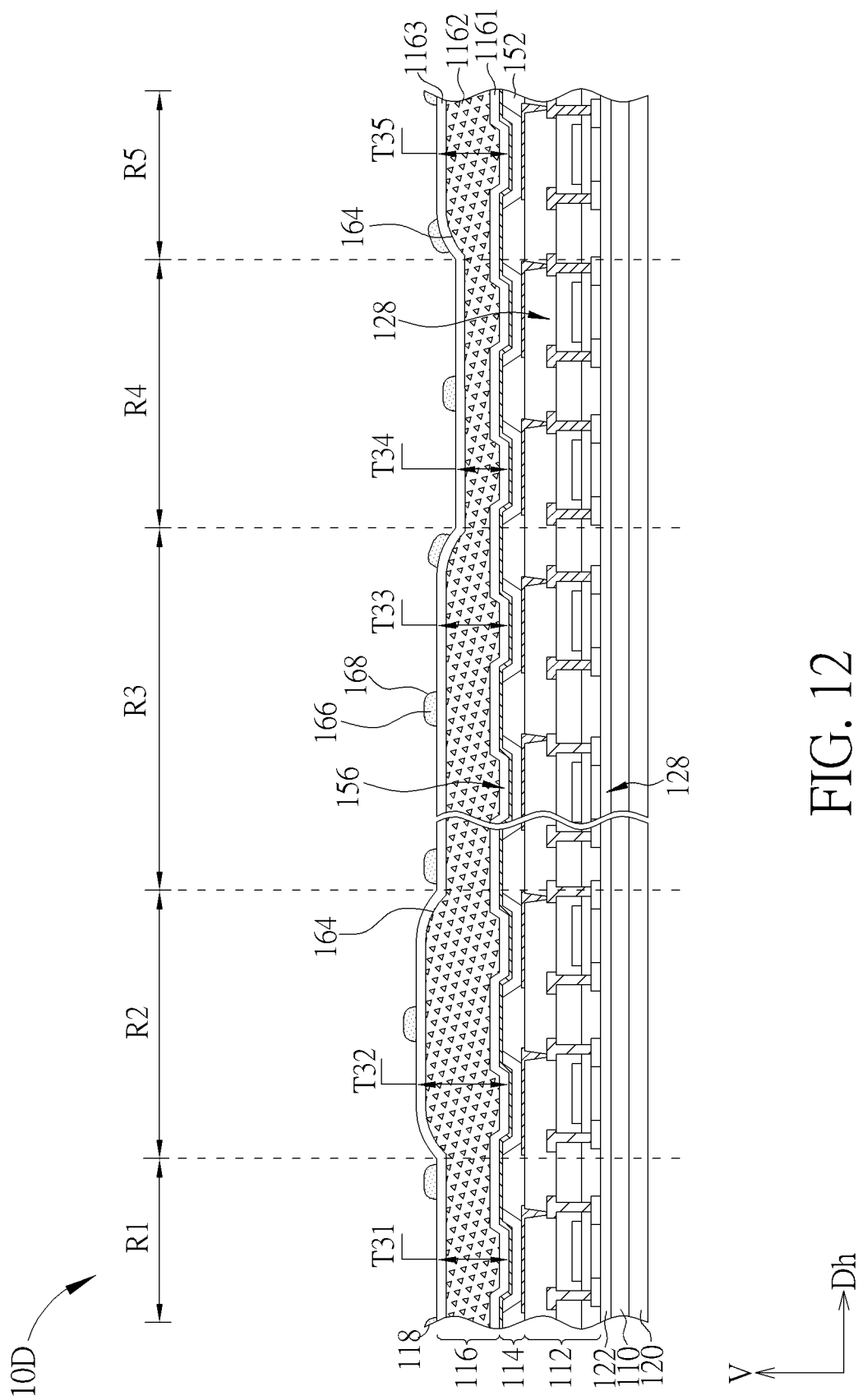
FIG. 12 is a cross-sectional schematic diagram of the display device according to the third embodiment.
Figure 13:
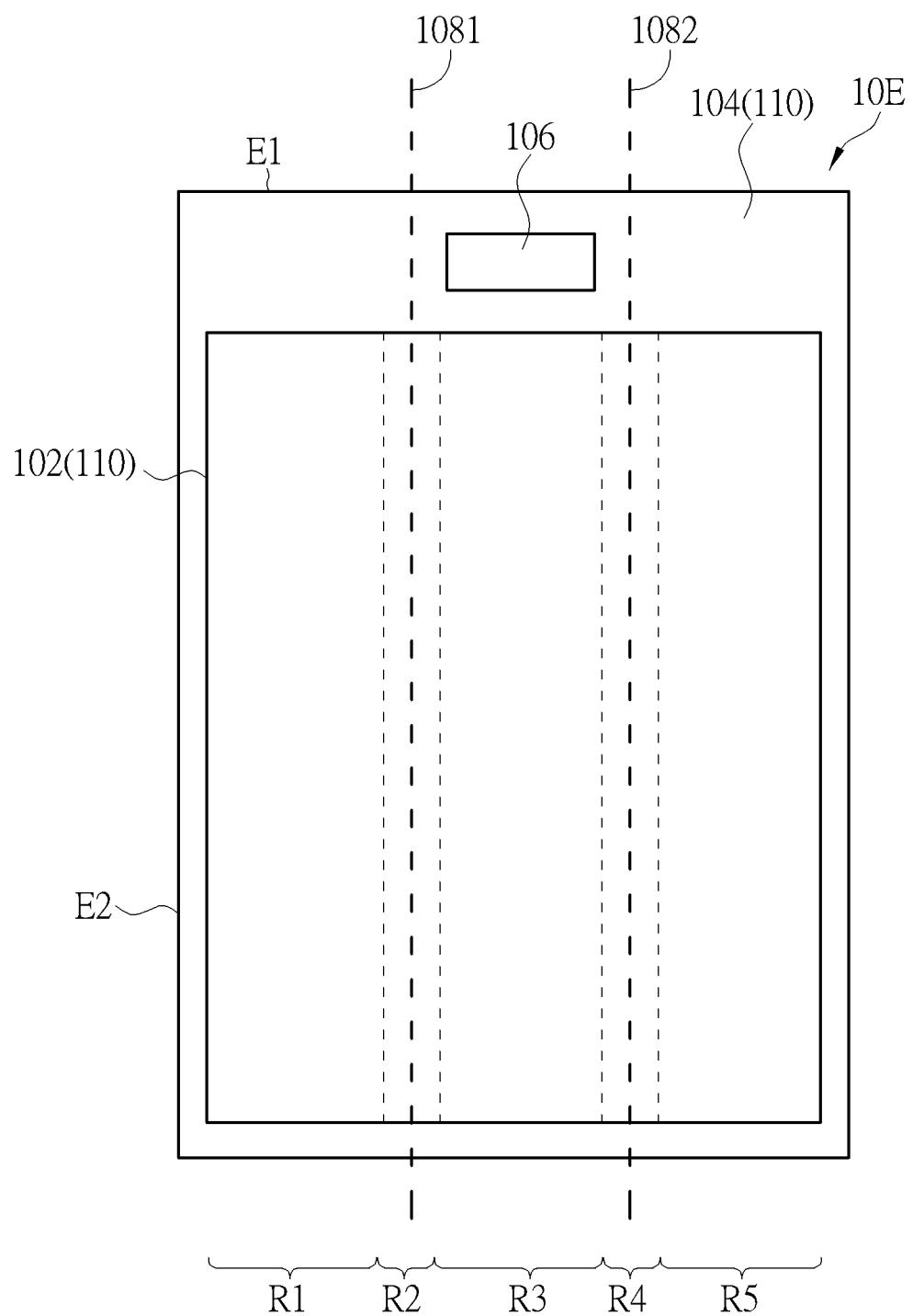
FIG. 13 is a top-view schematic diagram of a touch display device according to a variant embodiment of the third embodiment.

Referring to FIG. 11 to FIG. 13, FIG. 11 is a cross-sectional schematic diagram of the display device according to the third embodiment shown in FIG. 10 of the present disclosure, FIG. 12 is a cross-sectional schematic diagram of the display device according to the third embodiment, and FIG. 13 is a top-view schematic diagram of a touch display device according to a variant embodiment of the third embodiment. As shown in FIG. 13, the folding axis 1081 and the folding axis 1082 of a touch display device 10E are parallel to the edge E2 of the substrate 110, wherein the edge E2 has a longer length than the edge E1. In other words, the folding axis 1081 and the folding axis 1082 in this variant embodiment are rotated 90 degrees from that in FIG. 10. In addition, the arrangement of the first region R1, the second region R2, the third region R3, the fourth region R4, and the fifth region R5 are also rotated 90 degrees in this variant embodiment. The IC 106 in this variant embodiment is designed to have a smaller area in order to avoid the folding axis 1081 and the folding axis 1082 passing through the IC 106. For example, the IC 106 may be disposed between the folding axis 1081 and the folding axis 1082, and such configuration can prevent the IC 106 from being damaged by bending or folding.

As shown in FIG. 11, since the touch display device 10D has the folding axis 1081 and the folding axis 1082 (shown in FIG. 10), the touch display device 10D has a folding angle $\theta_1$ in the second region R2 and a folding angle $\theta_2$ in the fourth region R4 respectively. In this embodiment, the folding angle $\theta_1$ ranges from 0 degree to −180 degrees and the folding angle $\theta_2$ ranges from 0 degree to 180 degrees as an example, and the folding angle $\theta_1$ is −180 degrees and the folding angle $\theta_2$ is 180 degrees shown in FIG. 11. When the touch display device 10D is folded, the portions of the substrate 110 corresponding to the first region R1 and the third region R3 are placed between the portions of the display layer 114 corresponding to the first region R1 and the third region R3, while the portions of the display layer 114 corresponding to the third region R3 and the fifth region R5 are placed between the portions of the substrate 110 corresponding to the third region R3 and the fifth region R5. That is to say, the second region R2 is folded outwardly, while the fourth region R4 is folded inwardly with reference to the display surface of the touch display device 10C.

As shown in FIG. 12, the insulating layer 116 in this embodiment has a thickness T31 corresponding to the display unit(s) 156 of the first region R1, a thickness T32 corresponding to the display unit(s) 156 of the second region R2, a thickness T33 corresponding to the display unit(s) 156 of the third region R3, a thickness T34 corresponding to the display unit(s) 156 of the fourth region R4, and a thickness T35 corresponding to the display unit(s) 156 of the fifth region R5. Specifically, the thickness T31 can be measured corresponding to a central region of the display unit(s) 156 of the first region R1, the thickness T32 can be measured corresponding to a central region of the display unit(s) 156 of the second region R2, the thickness T33 can be measured corresponding to a central region of the display unit(s) 156 of the third region R3, the thickness T34 can be measured corresponding to a central region of the display unit(s) 156 of the fourth region R4, and the thickness T35 can be measured corresponding to a central region of the display unit(s) 156 of the fifth region R5. In this embodiment, the thicknesses of the insulating layer 116 in the unfolded regions, such as the thickness T31, the thickness T33, and the thickness T35, may be the same. Since the second region R2 of the touch display device 10D is folded outwardly, the stress accumulates in this region, and therefore the thickness T32 of the insulating layer 116 is designed to be greater than the thickness T31, the thickness T33, or the thickness T35. In another aspect, since the fourth region R4 of the touch display device 10D is folded inwardly, the stress accumulates in this region, and therefore the thickness T34 of the insulating layer 116 is designed to be smaller than the thickness T31, the thickness T33, or the thickness T35. The design of thickening or thinning the thickness of the insulating layer 116 in the folded regions can improve the stability or the reliability of the touch display device 10D and can also protect the display layer 114 underneath.

Though TFTs 128 in FIG. 12 are illustrated to be disposed below the corresponding display units 156 throughout the first region R1 to the fifth region R5 (e.g., all the display region 102), the technical features related to the TFTs 128 described in any of the above embodiments can be implemented in this embodiment as required. Further, the arrangements of the TFTs 128 in FIG. 14, FIG. 15, FIG. 17 and FIG. 22 below are also illustrated to be disposed under the corresponding display units 156, but the technical features related to the TFTs 128 described in any of the above embodiments can be implemented in those embodiments as required.

Figure 14:
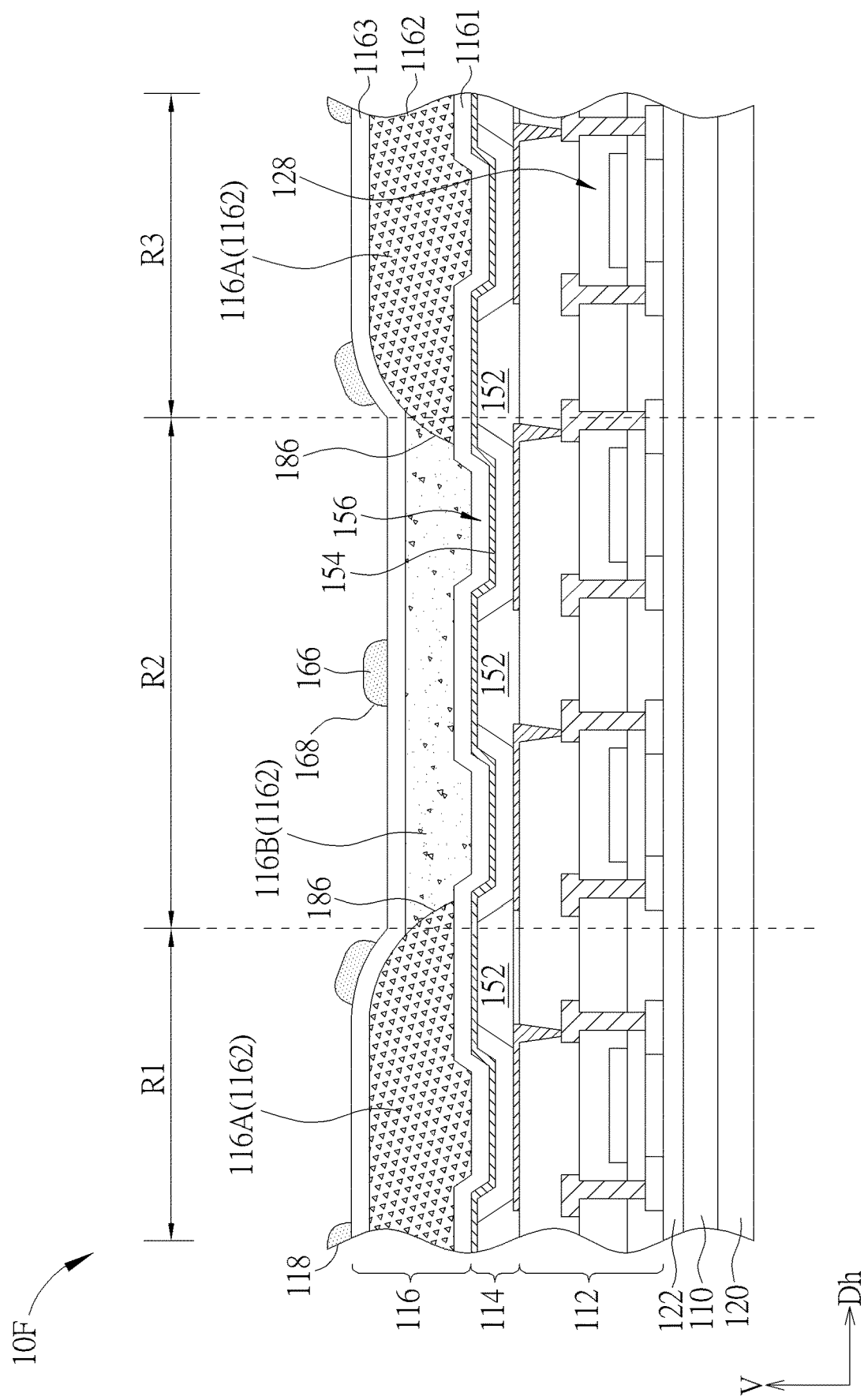
FIG. 14 is a cross-sectional schematic diagram of a touch display device according to a fourth embodiment.

Referring to FIG. 14, FIG. 14 is a cross-sectional schematic diagram of a touch display device according to a fourth embodiment. The main difference between this embodiment and the first embodiment is that the second layer 1162 of the touch display device 10F includes a first sub-layer 116A disposed in the first region R1 and the third region R3, and includes a second sub-layer 116B disposed in the second region R2, and a material of the first sub-layer 116A is different from a material of the second sub-layer 116B. In this embodiment, the Young's modulus of the first sub-layer 116A may be larger than the Young's modulus of the second sub-layer 116B, so that the second layer 1162 has better degree of resilience. In addition, the second layer 1162 that is formed of organic insulating materials can provide better elongation property, and can also mitigate cracking of the insulating layer 116 while the display is folded. For example, the second sub-layer 116B may include an organic insulating material such as a silicon based resin, and the Young's modulus of the second sub-layer 116B may be 0.001 Gpa to 0.05 Gpa. The first sub-layer 116A may include an organic insulating material including at least one selected from an acryl-based resin and an epoxy based resin, and the Young's modulus of the first sub-layer 116A may be 2 Gpa to 20 Gpa. In addition, multiple contacting interfaces 186 exist between the first sub-layer 116A and the second sub-layer 116B. The contacting interfaces 186 having the curved interfaces or prolonged interfaces can improve the adhesion between the first sub-layer 116A and the second sub-layer 116B.

Figure 15:
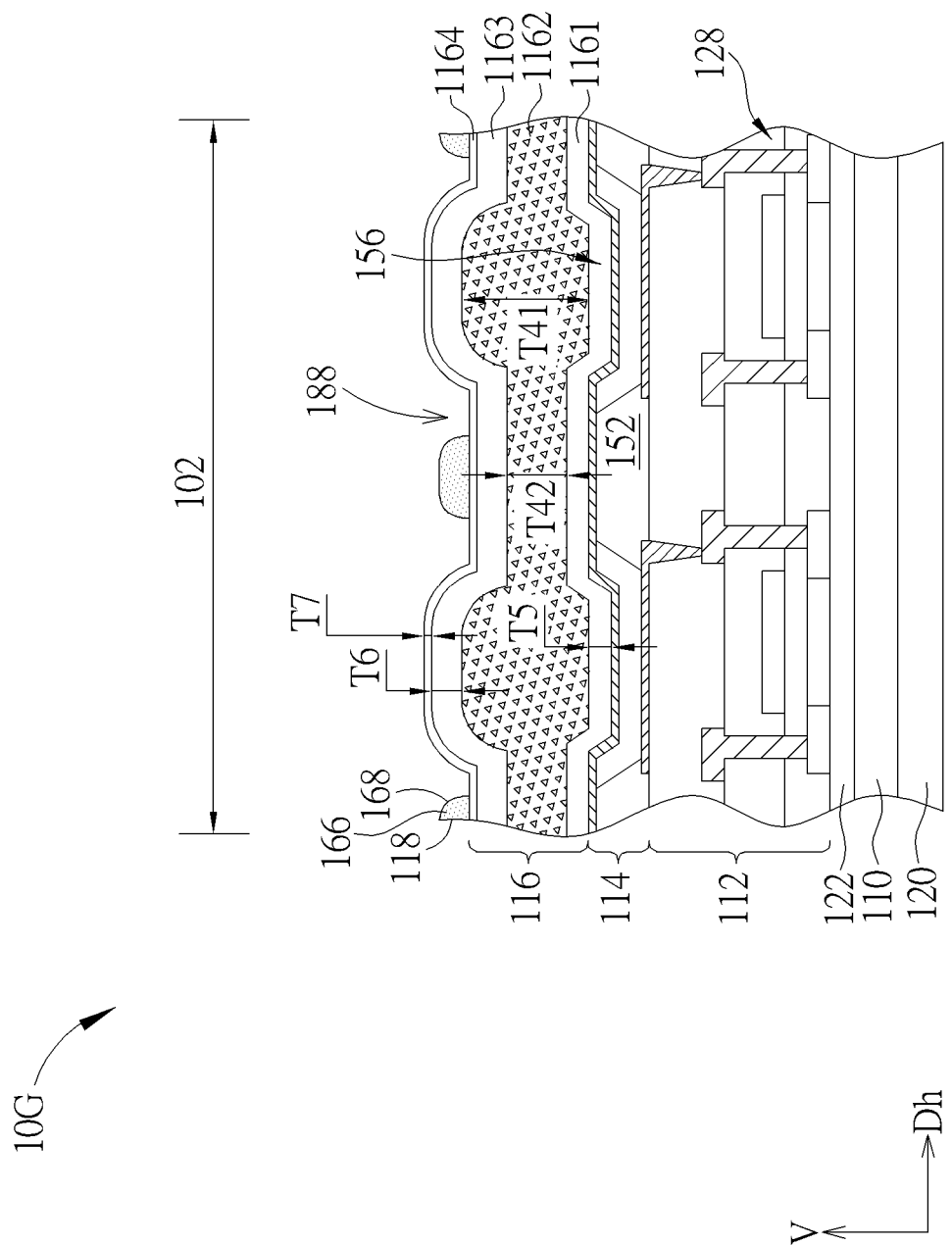
FIG. 15 is a cross-sectional schematic diagram of a touch display device according to a fifth embodiment.

Referring to FIG. 15, FIG. 15 is a cross-sectional schematic diagram of a touch display device according to a fifth embodiment, wherein FIG. 15 shows a portion of the display region 102. The main difference between this embodiment and the first embodiment is that the second layer 1162 of the touch display device 10G has a thickness (defined as a third thickness T41) corresponding to the display units 156 and a thickness (defined as a fourth thickness T42) corresponding to the barrier portion 152, and the third thickness T41 is greater than the fourth thickness T42. Specifically, the third thickness T41 can be measured corresponding to a central region of the display unit(s) 156, and the fourth thickness T42 can be measured corresponding to a central region of the barrier portion 152. Accordingly, a plurality of recesses 188 are formed due to the thickness variation of the insulating layer 116 above the barrier portion 152. The recesses 188 can reduce the stress and improve the stability or the reliability of the insulating layer 116. Also, the recesses 188 can make the touch display device 10G easily bent. In addition, the insulating layer 116 in this embodiment further includes a fourth layer 1164, wherein the third layer 1163 is disposed between the second layer 1162 and the fourth layer 1164. In this embodiment, the first layer 1161 has a thickness (defined as a fifth thickness T5) corresponding to the display units 156, the third layer 1163 has a thickness (defined as a sixth thickness T6) corresponding to the display units 156, and the sixth thickness T6 is greater than the fifth thickness T5. Further, the fourth layer 1164 has a thickness (defined as a seventh thickness T7) corresponding to the display units 156, and the fifth thickness T5 is greater than the seventh thickness T7. Specifically, the fifth thickness T5 of the first layer 1161 can be measured corresponding to a central region of the display unit(s) 156, the sixth thickness T6 of the third layer 1163 can be measured corresponding to a central region of the display unit(s) 156, and the seventh thickness T7 of the fourth layer 1164 can be measured corresponding to a central region of the display unit(s) 156. According to this embodiment, a shielding pattern (e.g., metal pattern, not shown) may be disposed between the fourth layer 1164 and the third layer 1163 in the peripheral region 104 (not shown), so as to reduce the influence on the signals of the touch electrode layer 118 by the signals of devices underneath, wherein the fourth layer 1164 electrically isolates the shielding pattern and the touch electrode layer 118. It should be noted that the fourth layer 1164 and the relative thickness relation between the sub layers of the insulating layer 116 may be applied to other embodiments or variant embodiments.

Figure 16:
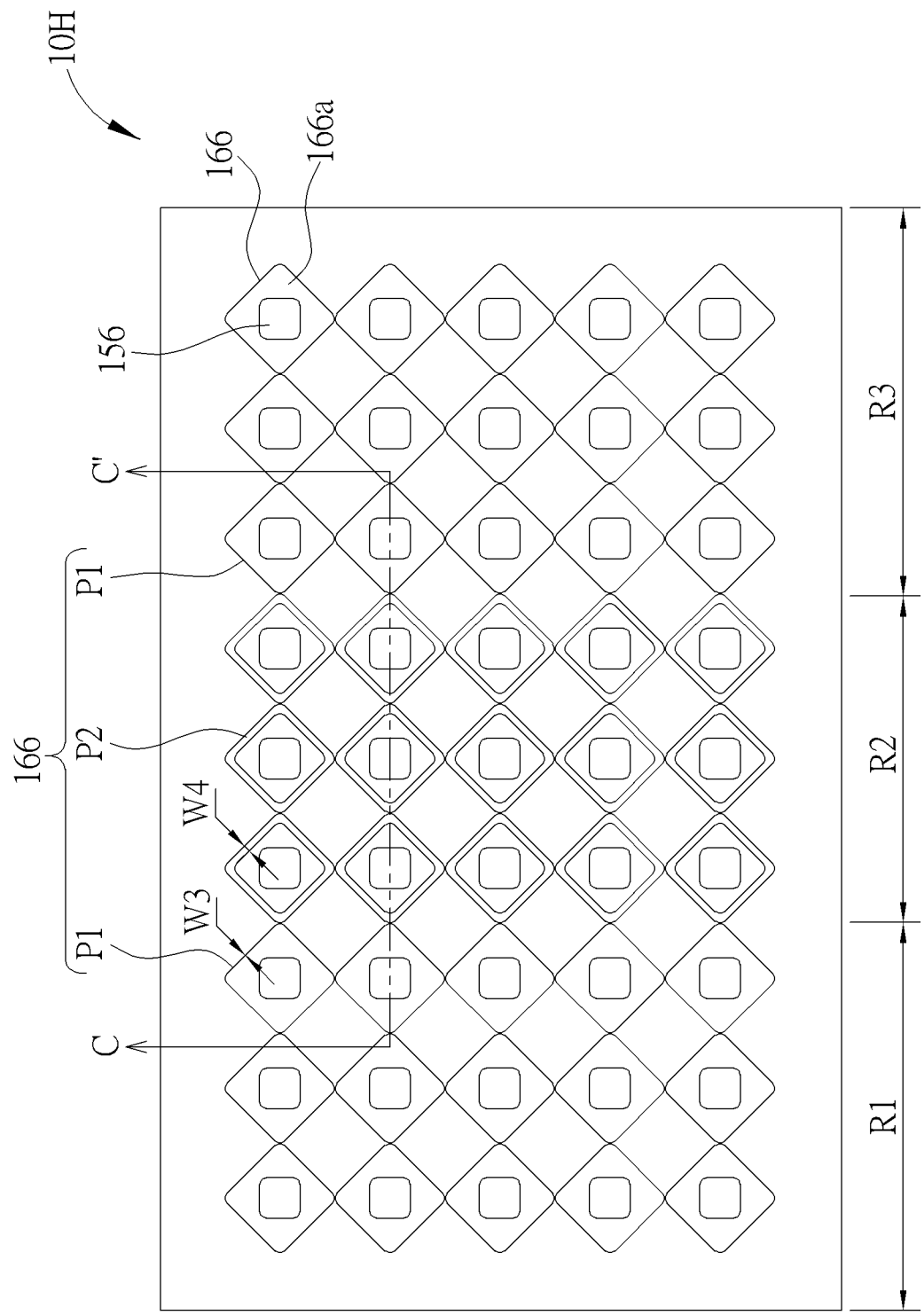
FIG. 16 is a top-view schematic diagram of a mesh structure and corresponding display units according to a sixth embodiment of the present disclosure.
Figure 17:
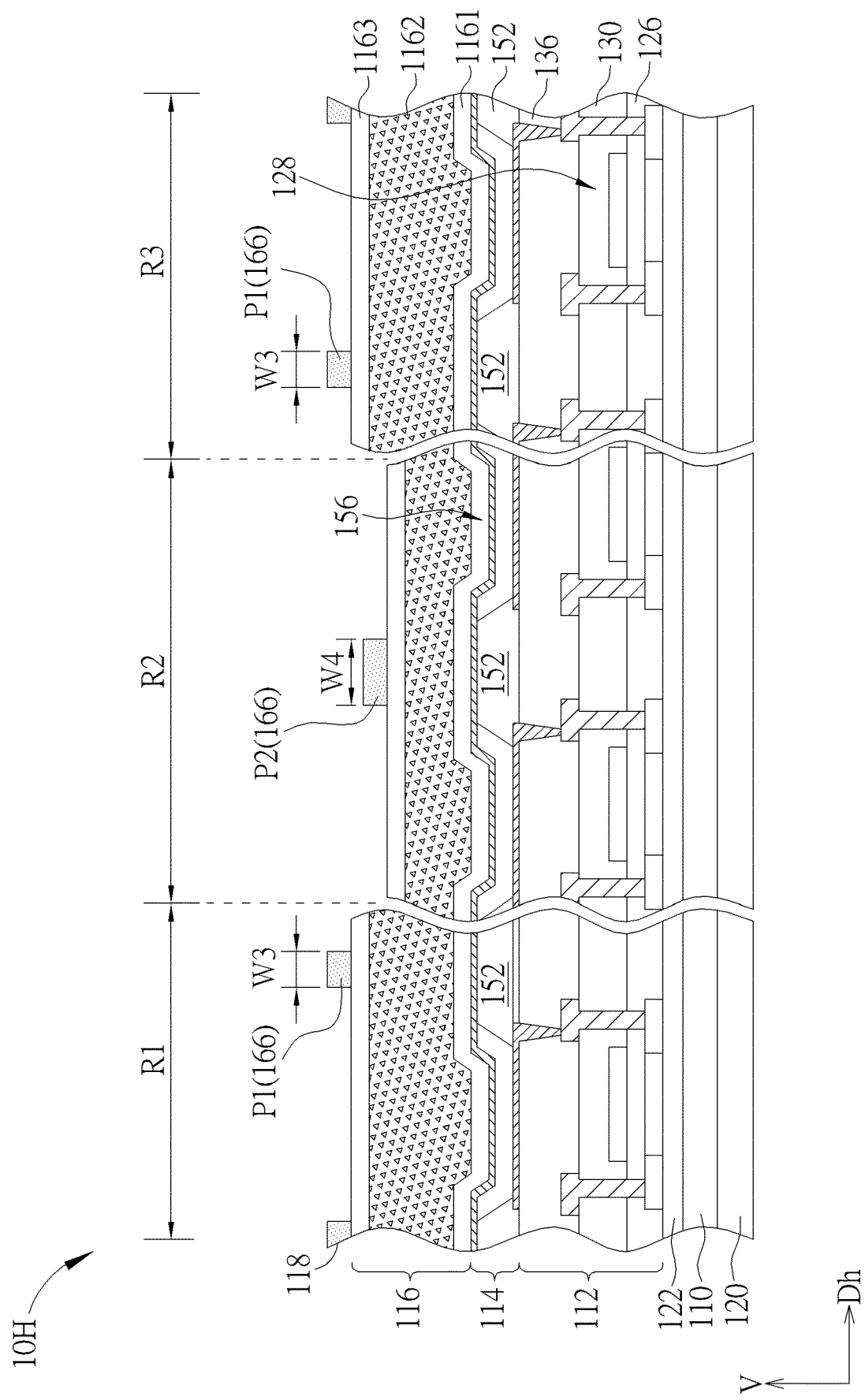
FIG. 17 is a cross-sectional schematic diagram taken along a line C-C' in FIG. 16.

Referring to FIG. 16 and FIG. 17, FIG. 16 is a top-view schematic diagram of a mesh structure and corresponding display units according to a sixth embodiment of the present disclosure, and FIG. 17 is a cross-sectional schematic diagram taken along a line C-C' in FIG. 16. As shown in FIG. 16 and FIG. 17, one of the differences between the touch display device 10H of this embodiment and the first embodiment is that a portion P1 of the mesh structure 166 corresponding to the first region R1 and the third region R3 has a first line width W3, a portion P2 of the mesh structure 166 corresponding to the second region R2 has a second line width W4, and the first line width W3 is different from the second line width W4. For example, the second line width W4 is greater than the first line width W3 in this embodiment, so as to strengthen the portion P2 of the mesh structure 166 while the second region R2 is folded.

Figure 18:
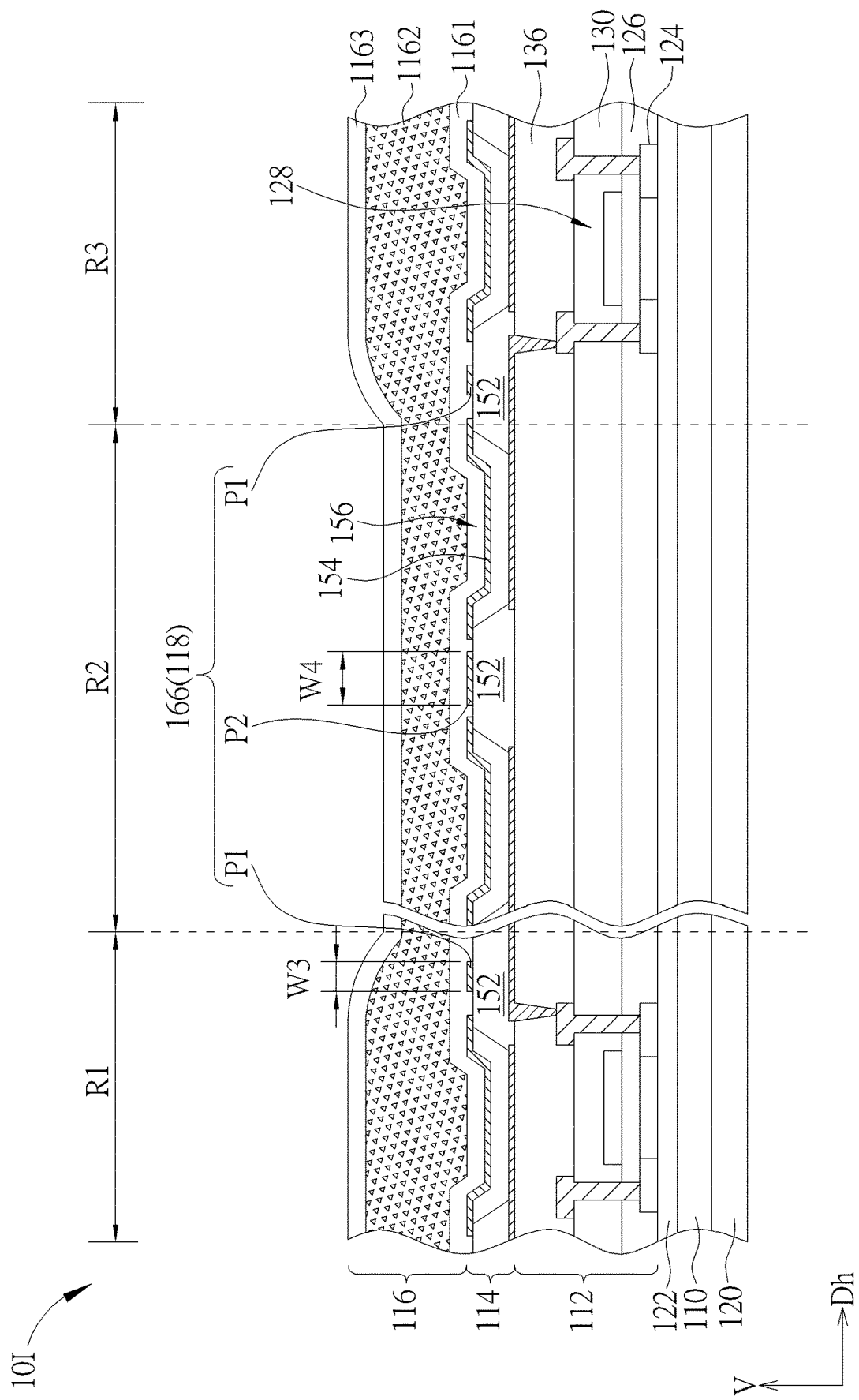
FIG. 18 is a cross-sectional schematic diagram of a touch display device according to a seventh embodiment.

Referring to FIG. 18, FIG. 18 is a cross-sectional schematic diagram of a touch display device according to a seventh embodiment. As shown in FIG. 18, the main difference between this embodiment and the first embodiment is that the touch electrode layer 118 is disposed between the insulating layer 116 and the substrate 110. In this embodiment, the mesh structure 166 of the touch display device 10I is disposed between the first layer 1161 of the insulating layer 116 and the barrier portion 152. The mesh structure 166 and the second electrodes 154 of the display units 156 may be formed of the same patterned conductive layer, wherein the mesh structure 166 is separated from the second electrodes 154, and the mesh structure 166 and the second electrodes 154 may be electrically isolated.

Figure 19:
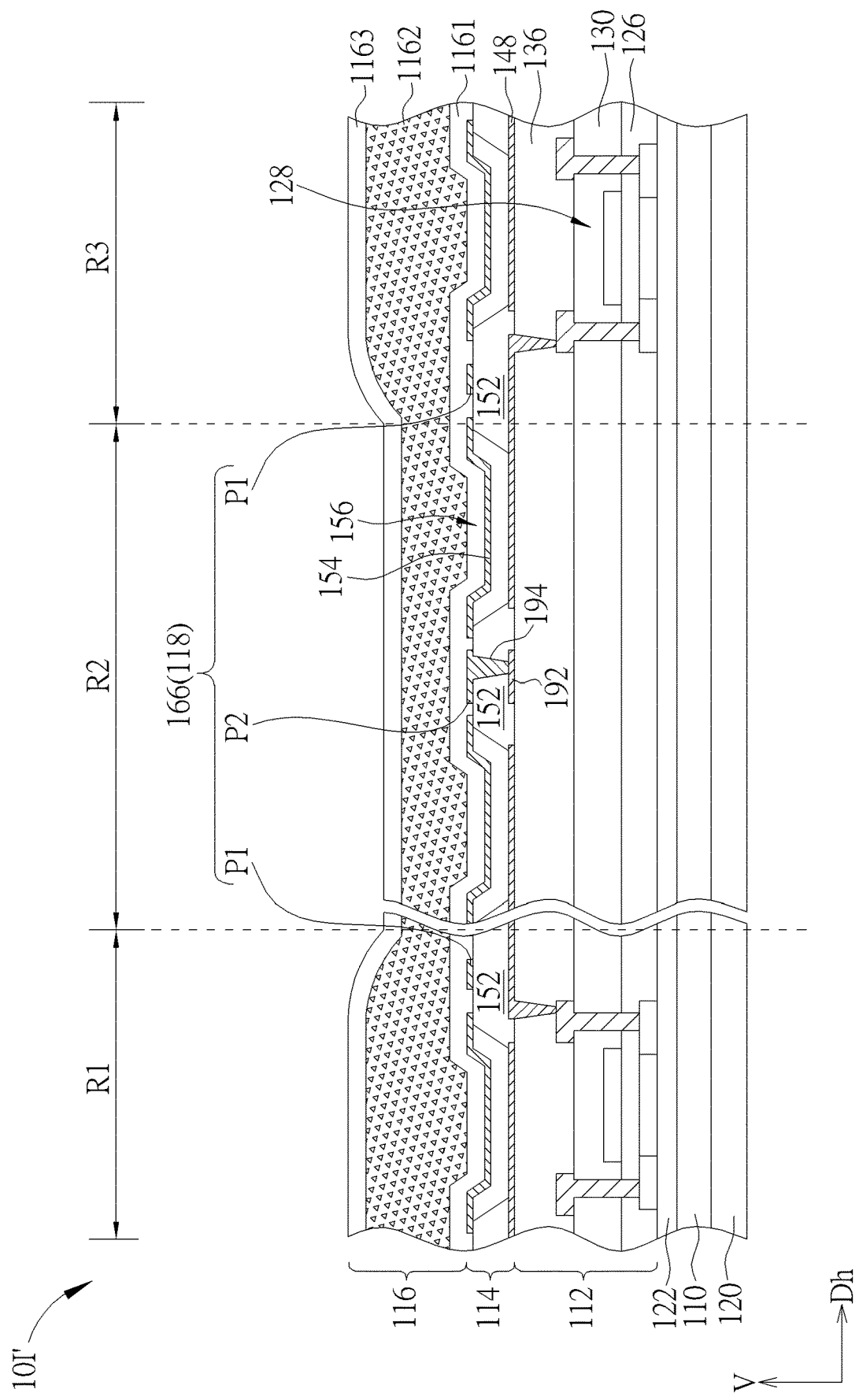
FIG. 19 is a cross-sectional schematic diagram of a touch display device according to a variant embodiment of the seventh embodiment.

Referring to FIG. 19, FIG. 19 is a cross-sectional schematic diagram of a touch display device according to a variant embodiment of the seventh embodiment. As shown in FIG. 19, the difference between the touch display device 10I' of this variant embodiment and the seventh embodiment is that one or more auxiliary electrodes 192 are disposed under the portion P2 of the mesh structure 166 corresponding to the second region R2, wherein the portion P2 of the mesh structure 166 is electrically connected to the corresponding auxiliary electrode 192 through a via hole 194 in the barrier portion 152. The auxiliary electrode 192 and the first electrodes 148 of the display units 156 may be formed of the same patterned conductive layer, wherein the auxiliary electrode 192 is separated from the first electrodes 148, and the auxiliary electrode 192 and the first electrodes 148 may be electrically isolated. The auxiliary electrode 192 may comprise metal, the mesh structure 166 may comprise transparent conductive material (such as ITO), and the auxiliary electrode 192 can reduce the resistance of the portion P2 of the mesh structure 166.

Figure 20:
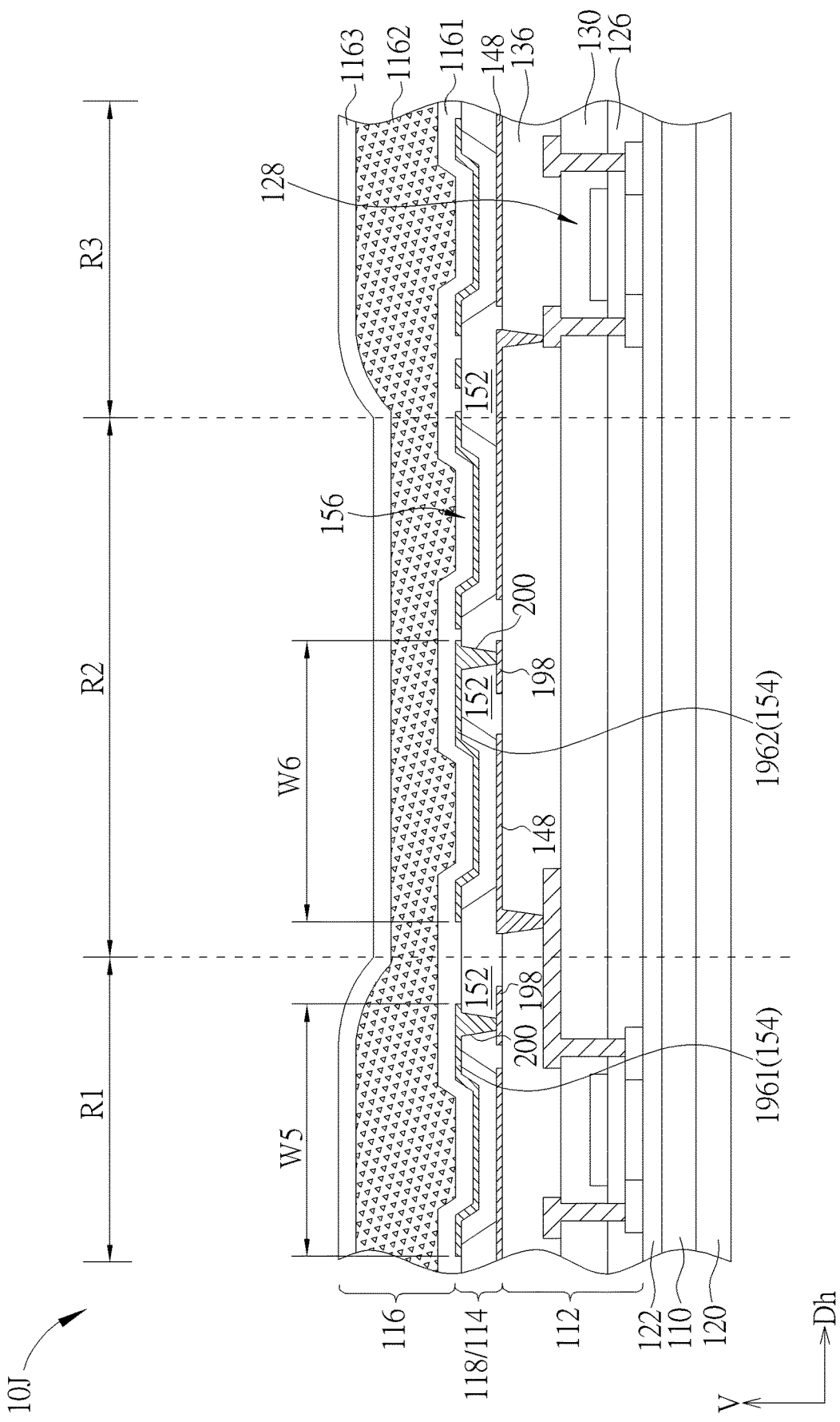
FIG. 20 is a cross-sectional schematic diagram of a touch display device according to an eighth embodiment.

Referring to FIG. 20, FIG. 20 is a cross-sectional schematic diagram of a touch display device according to an eighth embodiment. As shown in FIG. 20, the second electrodes 154 of the display units 156 of the touch display device 10J does not only used as the cathode in this embodiment. At least one second electrode 154 in the first region R1 is used as a touch electrode 1961, and at least one second electrode 154 in the second region R2 is used as a touch electrode 1962. The touch electrode 1961 and the touch electrode 1962 extend to the barrier portions 152 adjoining thereto. The timing of using one of the second electrodes 154 in the first region R1 as the touch electrode 1961 should not overlap with the timing of using the second electrode 154 as an anode or a cathode for controlling the corresponding display unit 156, and vice versa. The structure, function and operation method of the second electrodes 154 in the third region R3 may be similar to the second electrodes 154 in the first region R1. In another aspect, the timing of using one of the second electrodes 154 in the second region R2 as the touch electrode 1962 should not overlap with the timing of using the second electrode 154 as an anode or a cathode for controlling the corresponding display unit 156, and vice versa. The touch electrode 1961 has a first line width W5, the touch electrode 1962 has a second line width W6, and the second line width W6 is greater than the first line width W5. In addition, the touch electrode 1961 and the touch electrode 1962 are respectively electrically connected to touch signal lines 198 through via holes 200 in the barrier portion 152. The touch signal lines 198 and the first electrodes 148 of the display units 156 may be formed of the same patterned conductive layer, wherein the touch signal lines 198 are separated from the first electrodes 148, and the touch signal lines 198 and the first electrodes 148 may be electrically isolated. Since the touch electrode 1961 and the touch electrode 1962 are integrated into the second electrodes 154, the touch electrode layer 118 including the touch electrode 1961 and the touch electrode 1962 may be seen as including a patterned structure.

Figure 21:
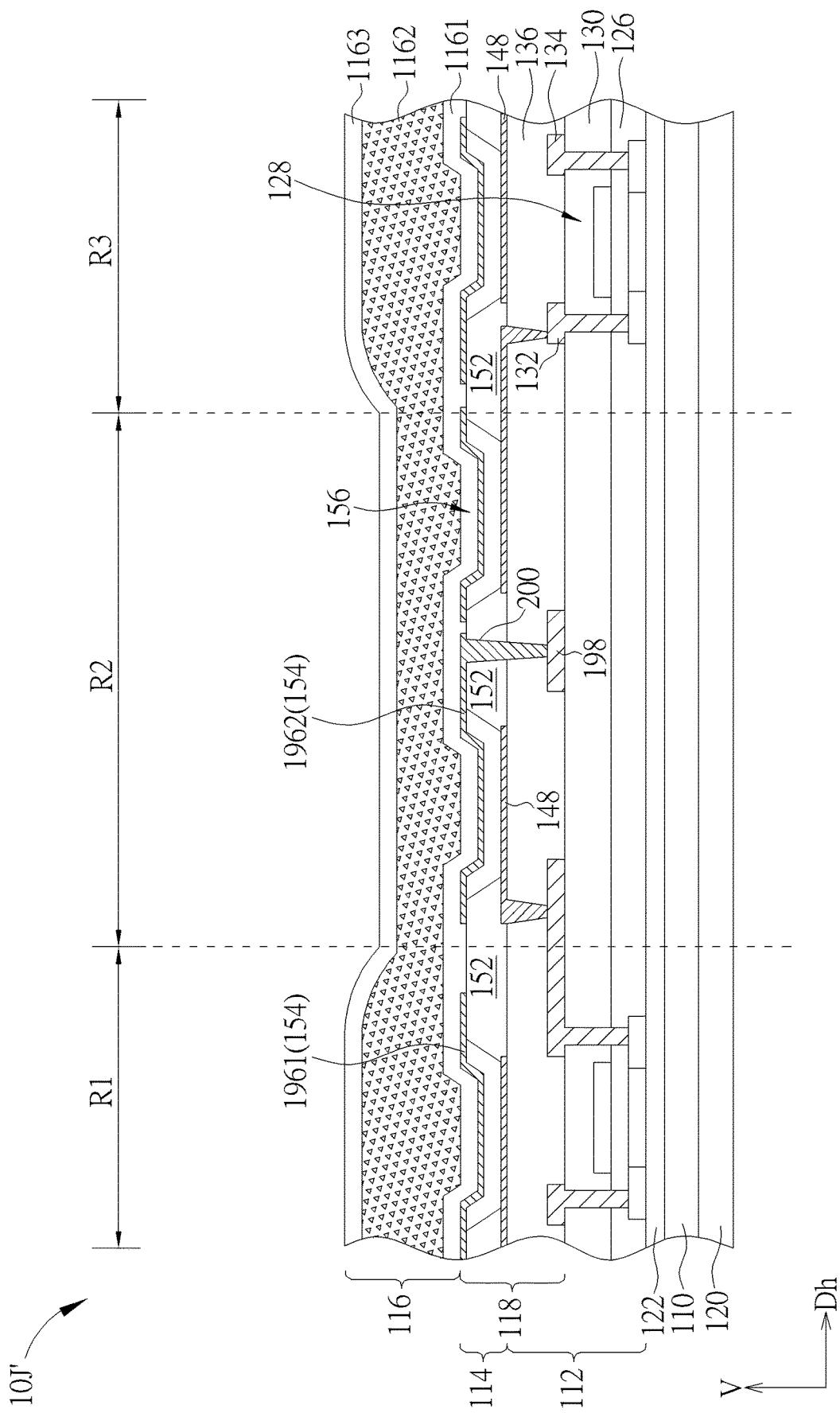
FIG. 21 is a cross-sectional schematic diagram of a touch display device according to a variant embodiment of the eighth embodiment.

Referring to FIG. 21, FIG. 21 is a cross-sectional schematic diagram of a touch display device according to a variant embodiment of the eighth embodiment. As shown in FIG. 21, the main difference between the touch display device 10J' of this variant embodiment and the eighth embodiment is that the touch electrode 1962 is electrically connected to the touch signal line 198 through the via hole 200, wherein the via hole 200 penetrates through the barrier portion 152 and the dielectric layer 136. The touch signal line 198, the drain electrodes 132 and the source electrodes 134 may be formed of the same patterned conductive layer, wherein the touch signal line 198 is separated from the drain electrodes 132 and the source electrodes 134, and the touch signal line 198 may be electrically isolated from the drain electrodes 132 and the source electrodes 134. In addition, the timing of using one of the second electrodes 154 as the touch electrode 1961 or the touch electrode 1962 should not overlap with the timing of using the second electrode 154 as an anode or a cathode for controlling the corresponding display unit 156, and vice versa.

Figure 22:
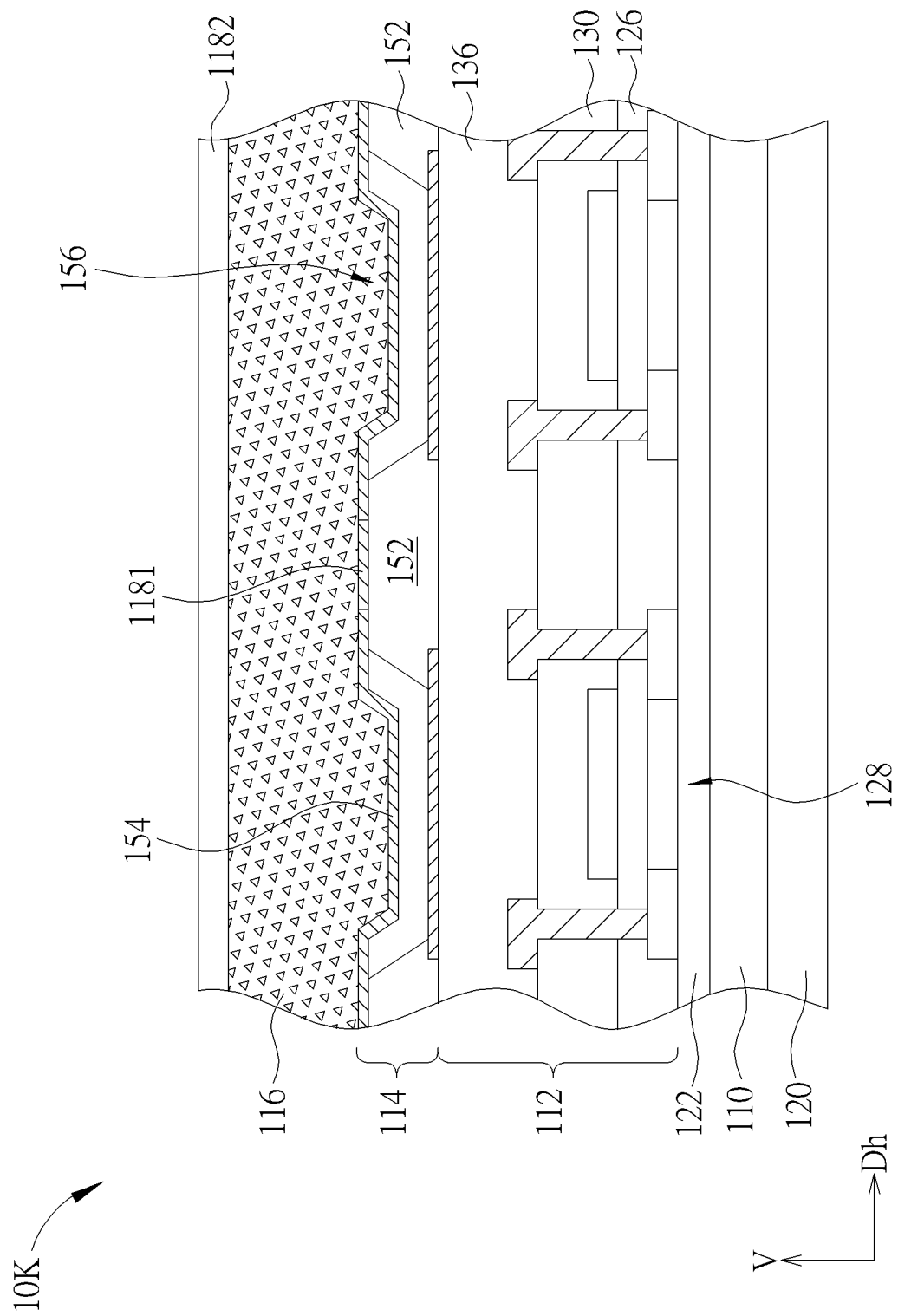
FIG. 22 is a cross-sectional schematic diagram of a touch display device according to a ninth embodiment.

Referring to FIG. 22, FIG. 22 is a cross-sectional schematic diagram of a touch display device according to a ninth embodiment. As shown in FIG. 22, the touch display device 10K includes a first touch electrode layer 1181 disposed between the insulating layer 116 and the substrate 110 and a second touch electrode layer 1182 disposed on the insulating layer 116, wherein the first touch electrode layer 1181 and the second electrodes 154 of the display units 156 may be formed of the same patterned conductive layer. Since the first touch electrode layer 1181 is spaced from the second touch electrode layer 1182 by the insulating layer 116, the first touch electrode layer 1181 and the second touch electrode layer 1182 can be electrically isolated. Various designs related to the touch electrode layer 118 described in the above embodiments may be implemented in the first touch electrode layer 1181 and the second touch electrode layer 1182 of this embodiment.

Figure 23:
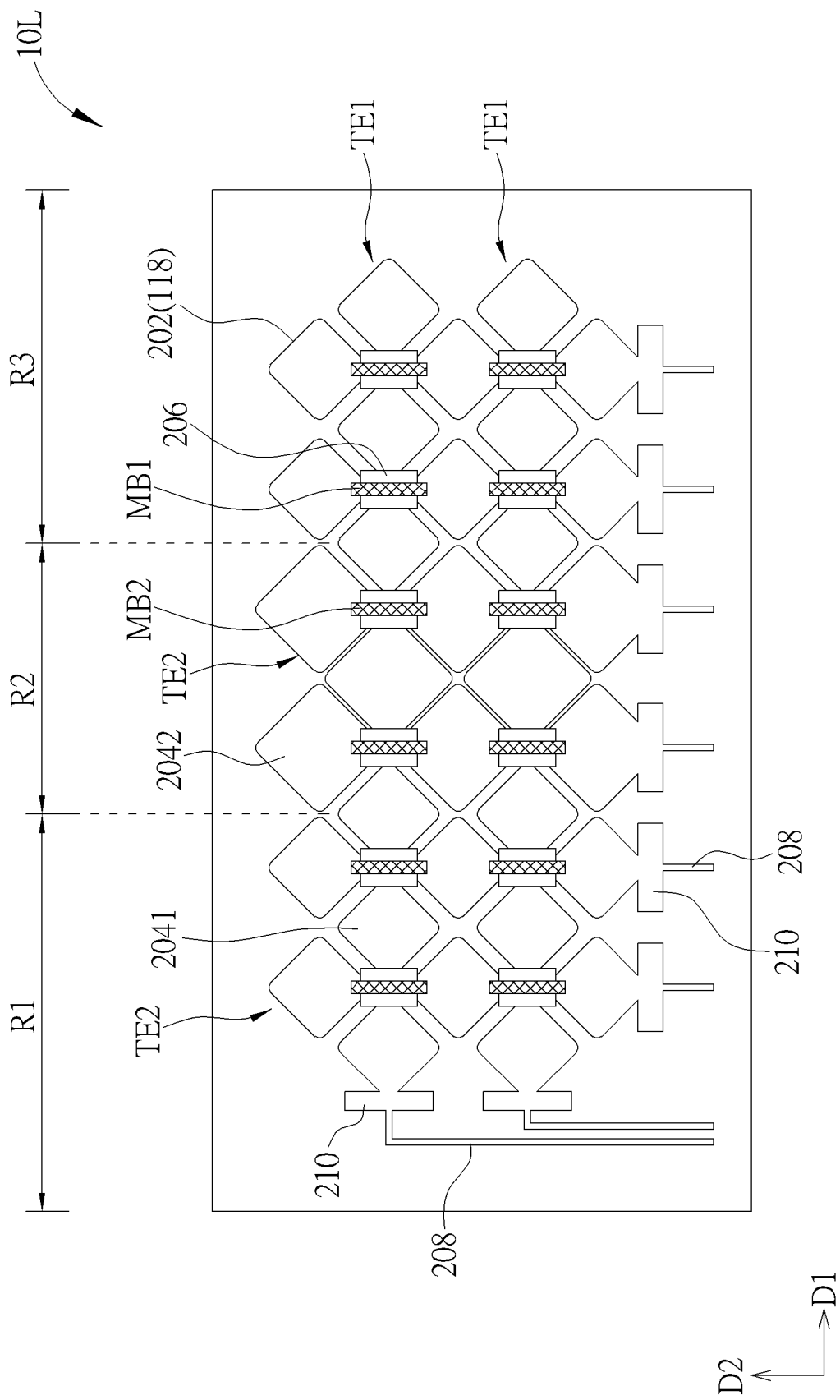
FIG. 23 is a top-view schematic diagram of a patterned structure according to a tenth embodiment of the present disclosure.

Referring to FIG. 23, FIG. 23 is a top-view schematic diagram of a patterned structure according to a tenth embodiment of the present disclosure. As shown in FIG. 23, the touch electrode layer 118 of the touch display device 10L in this embodiment includes a patterned structure 202 having a plurality of patterned units, wherein the patterned units are divided into a plurality of first patterned units 2041 and a plurality of second patterned units 2042. Most of the first patterned units 2041 are disposed in the first region R1 and the third region R3, a few of the first patterned units 2041 are disposed near the boundary of the first region R1 and the second region R2 or near the boundary of the third region R3 and the second region R2, extending across two regions, while each of the second patterned units 2042 is disposed in the second region R2. In one embodiment, the touch electrode layer 118 comprises a plurality of patterned units, the patterned units corresponding to the first region R1 have a first area respectively, the patterned units corresponding to the second region R2 have a second area respectively, and the first area is different from the second area. Based on the above-mentioned arrangement, the first patterned units 2041, including those disposed at the boundary of the first region R1 and the second region R2 or at the boundary of the third region R3 and the second region R2, are defined to be corresponding to the first region R1 and the third region R3. At least one of the first patterned units 2041 has a first area. The second patterned units 2042 is defined to be corresponding to the second region R2 and at least one of the second patterned units 2042 has a second area, wherein the first area is different from the second area. For example, the second area is greater than the first area in order to strengthen the patterned units 204 in the second region R2, so as to have better bending resistance. In addition, the resistance of the second patterned units 2042 in the second region R2 can also be reduced since their area is enlarged.

In this embodiment, some of the first patterned units 2041 and some of the second patterned units 2042 are sequentially arranged along the first direction D1 and electrically connected to each other to form plural first touch electrodes TE1, wherein the first touch electrodes TE1 are arranged side by side along the second direction D2. In another aspect, some of the first patterned units 2041 are sequentially arranged along the second direction D2 and electrically connected to each other through the bridges MB1 disposed between two adjacent first patterned units 2041 along the second direction D2 respectively, so as to form second touch electrodes TE2 in the first region R1 and the third region R3. In addition, some of the second patterned units 2042 are also sequentially arranged along the second direction D2 and electrically connected to each other through the bridges MB2 disposed between two adjacent second patterned units 2042 along the second direction D2 respectively, so as to form other second touch electrodes TE2 in the second region R2. The bridges MB1 and the bridges MB2 may be formed of conductive material such as metal, but not limited thereto. In addition, a plurality of insulating patterns 206 are disposed under the bridges MB1 and the bridges MB2, such that the second touch electrodes TE2 can be electrically isolated from the first touch electrodes TE1. The insulating patterns 206 can be formed of a suitable insulating material. In this embodiment, the second touch electrodes TE2 serve as the touch driving electrodes (Tx) and the first touch electrodes TE1 serve as the touch sensing electrodes (Rx), but not limited thereto. In addition, each of the first touch electrodes TE1 and the second touch electrodes TE2 is respectively electrically connected to a conductive line 208 by a connecting part 210. The first touch electrodes TE1 and the second touch electrodes TE2 may be further connected to ICs (not shown in FIG. 23) for example.

Figure 24:
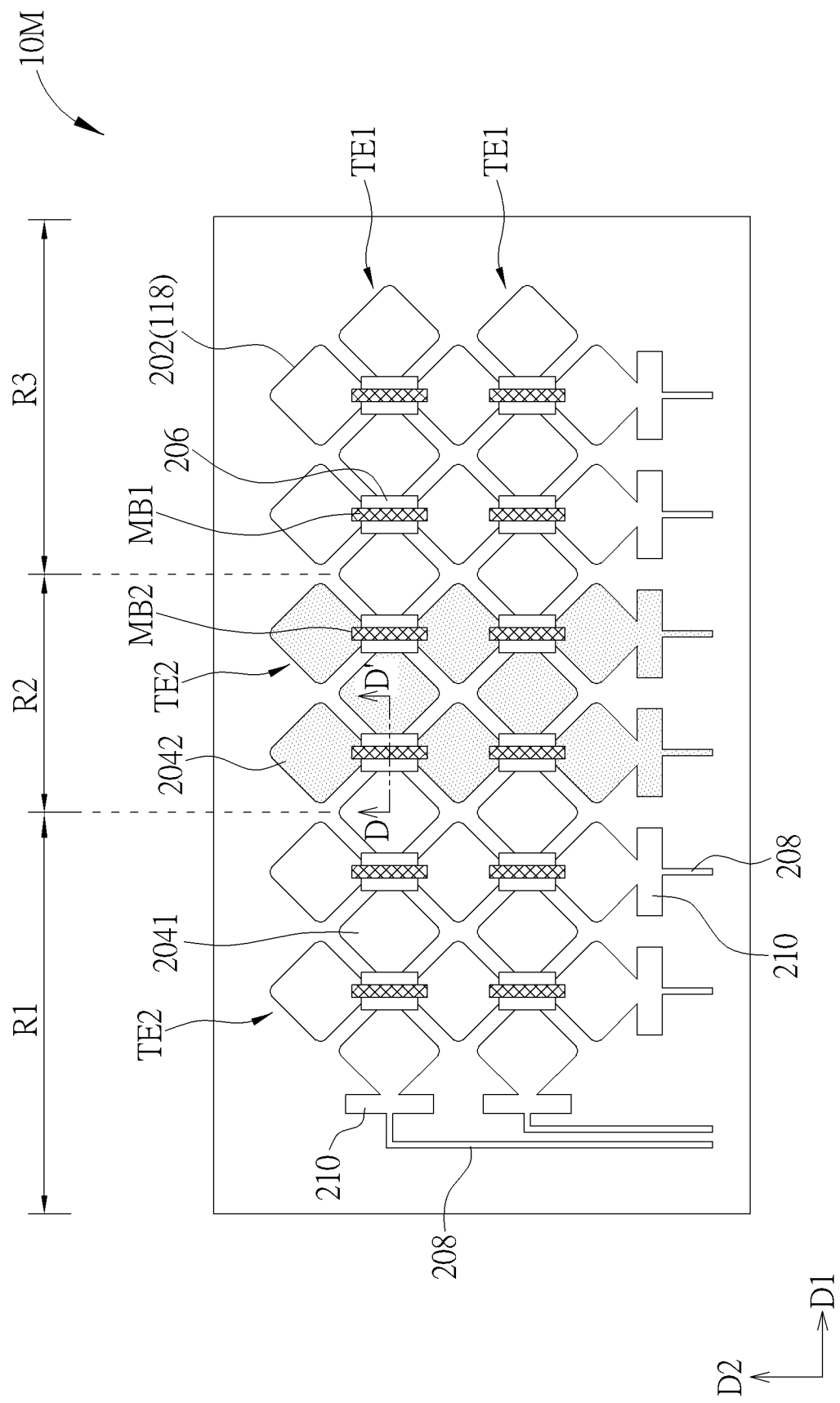
FIG. 24 is a top-view schematic diagram of a patterned structure according to an eleventh embodiment of the present disclosure.
Figure 25:
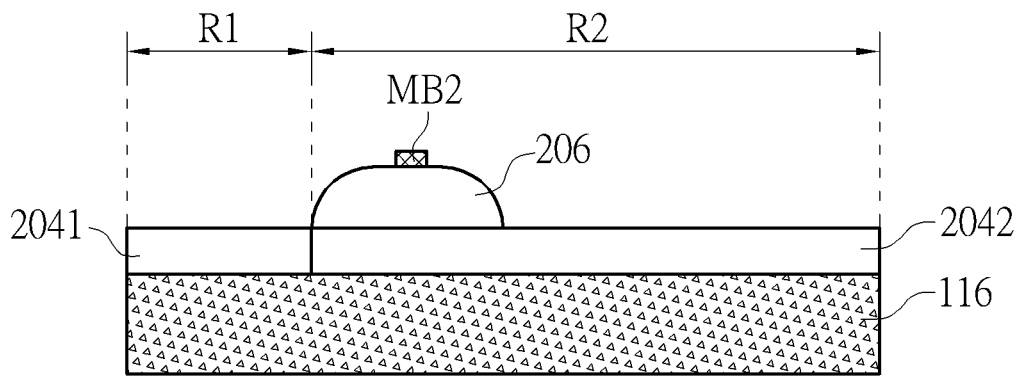
FIG. 25 is a cross-sectional schematic diagram taken along a line D-D' in FIG. 24.

Referring to FIG. 24 and FIG. 25, FIG. 24 is a top-view schematic diagram of a patterned structure according to an eleventh embodiment of the present disclosure, and FIG. 25 is a cross-sectional schematic diagram taken along a line D-D' in FIG. 24. As shown in FIG. 24 and FIG. 25, the difference between the touch display device 10M of this embodiment and the tenth embodiment is that a material or a structure of the first patterned units 2041 corresponding to the first region R1 and the third region R3 is different from a material or a structure of the second patterned units 2042 corresponding to the second region R2. For example, the material of the second patterned units 2042 may include a conductive material that has lower resistance or a conductive material that has good bending resistance, so as to improve the stability or the reliability of the touch display device 10M, while the first patterned units 2041 may include a different conductive material or a different conductive layer. In other words, the first patterned units 2041 and the second patterned units 2042 may be formed of different conductive layers. As an example, the material of the second patterned units 2042 may include silver nano-wires (AgNW), metal-mesh, polyethylenedioxythiphene (PEDOT), carbon nano-tubes (CNT) or the like, and the material of the first patterned units 2041 may include ITO, IZO, Al-doped ZnO (AZO) or the like. In this embodiment, the patterned units 204 have the same area, but not limited thereto.

Figure 26:
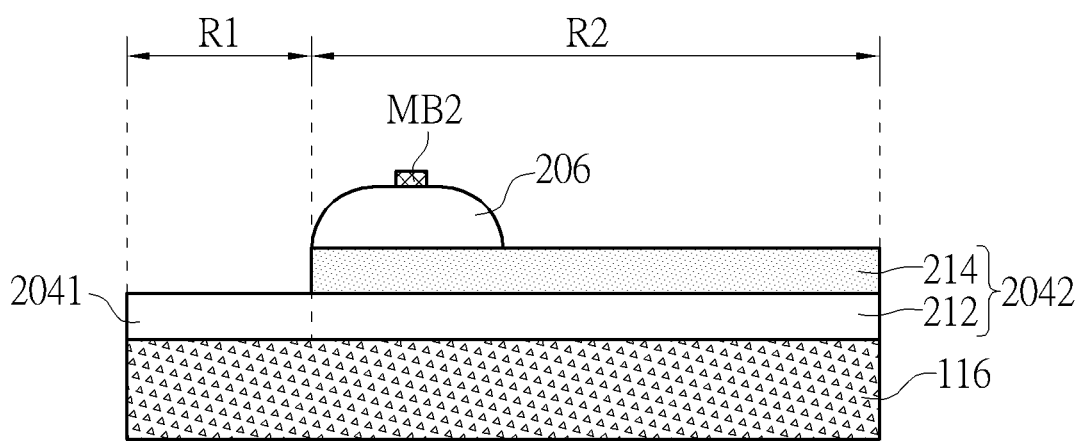
FIG. 26 is a cross-sectional schematic diagram taken along a line D-D' in FIG. 24 according to a first variant embodiment of the eleventh embodiment.

Referring to FIG. 26, FIG. 26 is a cross-sectional schematic diagram taken along a line D-D' in FIG. 24 according to a first variant embodiment of the eleventh embodiment. As shown in FIG. 26, in this variant embodiment, the first patterned unit 2041 corresponding to the first region R1 or the third region R3 shown in FIG. 24 includes a first patterned conductive layer 212, and the second patterned unit 2042 corresponding to the second region R2 includes the first patterned conductive layer 212 and a second patterned conductive layer 214 disposed on the first patterned conductive layer 212. In this variant embodiment, the first patterned conductive layer 212 is disposed in the first region R1, the second region R2, and the third region R3, while the second patterned conductive layer 214 is disposed only in the second region R2, but not limited thereto. In addition, the material of the second patterned conductive layer 214 may include a material that has good bending resistance, such as the material of the second patterned units 2042 described in the eleventh embodiment. Accordingly, even though the first patterned conductive layer 212 in the second region R2 is cracked during folding, the patterned units 204 corresponding to the second region R2 can still work through the second patterned conductive layer 214. Therefore, the stability or the reliability of the touch display device can be improved.

Figure 27:
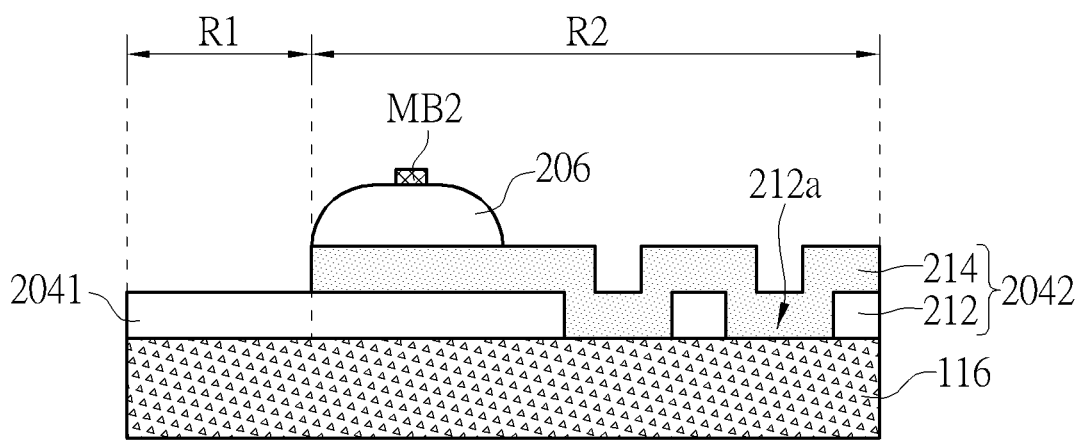
FIG. 27 is a cross-sectional schematic diagram taken along a line D-D' in FIG. 24 according to a second variant embodiment of the eleventh embodiment.

Referring to FIG. 27, FIG. 27 is a cross-sectional schematic diagram taken along a line D-D' in FIG. 24 according to a second variant embodiment of the eleventh embodiment. As shown in FIG. 27, the difference between this variant embodiment and the first variant embodiment above is that a portion of the first patterned conductive layer 212 corresponding to the second region R2 has a plurality of openings 212a, and the second patterned conductive layer 214 is filled in the openings 212a. For example, the openings 212a of the first patterned conductive layer 212 can reduce the stress therein during folding, and the stability or the reliability of the touch display device can also be improved.

To summarize the above descriptions, the touch display device of the present disclosure is capable of being folded in some manners, wherein the thickness of the insulating layer in the folding region can be adjusted to be different from other regions. In addition, in the touch electrode layer, the width of the mesh structure or the area of the patterned units in the folding region can be different from other regions, such as being enlarged. The material of the insulating layer of the touch electrode layer in the folding region can be adjusted to provide better flexibility. Also, the number of the TFTs disposed in the folding region can be reduced, and the W/L ratio of the channel can be adjusted to be different from other regions. The technical features mentioned above can at least improve the stability or the reliability of the foldable touch display device of the present disclosure.

Those skilled in the art will readily observe that numerous modifications and alterations of the device and method may be made while retaining the teachings of the disclosure.

Accordingly, the above disclosure should be construed as limited only by the metes and bounds of the appended claims.

What is claimed is:

1. A touch display device, comprising:
   a substrate;
   a display layer disposed on the substrate and comprising a first region, a second region, and a third region, wherein the second region is located between the first region and the third region, and the second region is foldable, wherein the display layer comprises a barrier portion and a plurality of display units, and the barrier portion is disposed between adjacent ones of the plurality of display units;
   an insulating layer disposed on the display layer; and
   a touch electrode layer directly contacting the insulating layer and comprising a mesh structure, wherein the insulating layer is disposed between the display layer and the mesh structure,
   wherein the insulating layer comprises a first layer, a second layer, and a third layer, the second layer is disposed between the first layer and the third layer, the first layer and the third layer are formed of inorganic insulating materials, the second layer is formed of organic insulating material, a thickness of the first layer is greater than a thickness of the third layer, the second layer has a first thickness corresponding to the plurality of display units and has a second thickness corresponding to the barrier portion, and the first thickness is greater than the second thickness.

2. The touch display device as claimed in claim 1, further comprising a polarizer and a cover layer, wherein the polarizer is disposed between the touch electrode layer and the cover layer.

3. The touch display device as claimed in claim 1, further comprising a supporting film and a thin film transistor layer, wherein the substrate is disposed between the supporting film and the thin film transistor layer.

4. The touch display device as claimed in claim 1, wherein the mesh structure is overlapped with the barrier portion.

5. The touch display device as claimed in claim 1, wherein the first layer directly contacts the second layer and the second layer directly contacts the third layer.

6. The touch display device as claimed in claim 1, wherein the substrate is a continuous structure.

7. The touch display device as claimed in claim 1, wherein the second layer has at least one tapered surface close to a border of the second region.

8. The touch display device as claimed in claim 1, wherein the mesh structure has a curve edge.

* * * * *